US008431883B2

(12) United States Patent
Yanagisawa et al.

(10) Patent No.: US 8,431,883 B2
(45) Date of Patent: Apr. 30, 2013

(54) PHOTOELECTRIC CONVERSION DEVICE COMPRISING A CURRENT MIRROR CIRCUIT CONNECTED TO A FIELD EFFECT TRANSISTOR, A BUFFER AND A VOLTAGE DETECTION CIRCUIT

(75) Inventors: Makoto Yanagisawa, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 350 days.

(21) Appl. No.: 12/141,394

(22) Filed: Jun. 18, 2008

(65) Prior Publication Data

US 2009/0001256 A1  Jan. 1, 2009

(30) Foreign Application Priority Data

Jun. 29, 2007  (JP) ................. 2007-171483

(51) Int. Cl.
*H01L 31/00* (2006.01)
*H03F 3/08* (2006.01)

(52) U.S. Cl.
USPC ................. 250/214.1; 250/214 A

(58) Field of Classification Search ........... 250/214 A, 250/214.1, 214 AL, 206, 239, 205, 214 C; 257/461–465, 290–292, 257; 356/218–227; 330/59, 288, 308, 277; 327/51–53, 511, 327/514, 515
See application file for complete search history.

(56) References Cited

U.S. PATENT DOCUMENTS

| | | | |
|---|---|---|---|
| 4,498,001 A * | 2/1985 | Smoot ................. 250/214 A |
| 5,241,575 A | 8/1993 | Miyatake et al. |
| 5,369,462 A * | 11/1994 | Miyazawa et al. ............ 396/54 |
| 5,381,146 A * | 1/1995 | Kolte ................. 341/132 |
| 5,801,581 A * | 9/1998 | Koizumi ................. 327/538 |
| 5,936,231 A | 8/1999 | Michiyama et al. |
| 6,243,155 B1 | 6/2001 | Zhang et al. |
| 6,287,888 B1 | 9/2001 | Sakakura et al. |
| 6,495,816 B1 | 12/2002 | Brodeur |
| 6,642,500 B2 | 11/2003 | Takahashi |
| 7,030,551 B2 | 4/2006 | Yamazaki et al. |
| 7,253,391 B2 | 8/2007 | Koyama et al. |
| 7,423,639 B2 | 9/2008 | Min |
| 7,485,838 B2 | 2/2009 | Nishi et al. |

(Continued)

FOREIGN PATENT DOCUMENTS

| | | |
|---|---|---|
| EP | 1 724 844 A2 | 11/2006 |
| JP | 03-192764 A | 8/1991 |

(Continued)

*Primary Examiner* — Que T Le
*Assistant Examiner* — Jennifer Bennett
(74) *Attorney, Agent, or Firm* — Fish & Richardson P.C.

(57) ABSTRACT

It is an object to provide a photoelectric conversion device which can solve the problem of leakage current or noise caused when the photoelectric conversion device is connected to an external circuit by amplifying the current flows through the photoelectric conversion element, and which can widen dynamic range of the output voltage which is obtained in accordance with the current flowing through the photoelectric conversion element. The photoelectric conversion device includes a voltage detection circuit, and a photoelectric conversion circuit including a photoelectric conversion element, a current mirror circuit, and a field effect transistor. The current mirror circuit is a circuit which amplifies and outputs a photocurrent generated at the photoelectric conversion element. The voltage detection circuit is connected to the gate terminal of the field effect transistor so as to detect generated voltage.

39 Claims, 21 Drawing Sheets

U.S. PATENT DOCUMENTS

| | | | |
|---|---|---|---|
| 7,737,478 B2 | 6/2010 | Yanagisawa et al. | |
| 7,838,812 B2 | 11/2010 | Nishi et al. | |
| 8,049,157 B2 | 11/2011 | Nishi et al. | |
| 8,124,924 B2 | 2/2012 | Yanagisawa et al. | |
| 2002/0011978 A1 | 1/2002 | Yamazaki et al. | |
| 2004/0101309 A1* | 5/2004 | Beyette et al. | 398/115 |
| 2005/0100977 A1* | 5/2005 | Yang et al. | 435/11 |
| 2005/0167573 A1 | 8/2005 | Maruyama et al. | |
| 2006/0044300 A1 | 3/2006 | Koyama et al. | |
| 2006/0186497 A1 | 8/2006 | Nishi et al. | |
| 2006/0220252 A1 | 10/2006 | Yukawa et al. | |
| 2006/0260675 A1 | 11/2006 | Sugawara et al. | |
| 2006/0261253 A1* | 11/2006 | Arao et al. | 250/214.1 |
| 2006/0262054 A1 | 11/2006 | Yamazaki et al. | |
| 2007/0045672 A1 | 3/2007 | Nishi et al. | |
| 2007/0113886 A1 | 5/2007 | Arao et al. | |
| 2007/0187790 A1 | 8/2007 | Takahashi et al. | |
| 2007/0257248 A1 | 11/2007 | Arao et al. | |
| 2007/0267665 A1 | 11/2007 | Koyama et al. | |
| 2008/0001148 A1 | 1/2008 | Nishi et al. | |
| 2008/0078923 A1 | 4/2008 | Hirose | |
| 2008/0099664 A1 | 5/2008 | Yamazaki et al. | |
| 2008/0158137 A1 | 7/2008 | Yoshida | |
| 2008/0237665 A1 | 10/2008 | Shishido | |
| 2008/0237669 A1* | 10/2008 | Yanagisawa et al. | 257/292 |
| 2009/0027372 A1 | 1/2009 | Shishido et al. | |
| 2012/0145887 A1 | 6/2012 | Yanagisawa et al. | |

FOREIGN PATENT DOCUMENTS

| | | |
|---|---|---|
| JP | 08-289205 | 11/1996 |
| JP | 08-289205 A | 11/1996 |
| JP | 2005-129909 | 5/2005 |
| JP | 2005-203783 A | 7/2005 |
| JP | 2006-352098 A | 12/2006 |
| JP | 2007-059889 A | 3/2007 |
| JP | 2008-270765 A | 11/2008 |
| WO | 2007/013534 A1 | 2/2007 |
| WO | 2008/123119 A1 | 10/2008 |

* cited by examiner

PHOTOELECTRIC CONVERSION DEVICE COMPRISING A CURRENT MIRROR CIRCUIT CONNECTED TO A FIELD EFFECT TRANSISTOR, A BUFFER AND A VOLTAGE DETECTION CIRCUIT

BACKGROUND OF THE INVENTION

1. Field of the Invention

The present invention relates to a photoelectric conversion device, and particularly relates to a photoelectric conversion device including thin film semiconductor elements. In addition, the present invention relates to electronic devices using the photoelectric conversion devices.

2. Description of the Related Art

A number of photoelectric conversion devices used for detecting an electromagnetic wave are generally known, and for example, photoelectric conversion devices having sensitivity from ultraviolet rays to infrared rays are collectively referred to as optical sensors. Among them, an optical sensor having sensitivity in a visible light region with a wavelength of 400 to 700 nm is particularly referred to as a visible light sensor, and a large number of visible light sensors are used for devices which need illuminance adjustment, on/off control, or the like depending on human living environment.

In some display devices, ambient brightness of the display device is detected to adjust display luminance. This is because unnecessary electric power of the display device can be reduced by detecting ambient brightness by an optical sensor and obtaining appropriate display luminance. For example, examples of display devices which have an optical sensor for adjusting luminance include a mobile phone and a computer.

In addition, as well as the ambient brightness of the display device, luminance of the backlight of a display device, in particular, a liquid crystal display device is also detected by an optical sensor to adjust luminance of a display screen.

As an optical sensor, a circuit in which a photoelectric conversion element such as a photodiode or the like is used for a light sensing part, a current which flows through an photoelectric conversion element in accordance with the incident light is made to flow through a resistor element, and ambient brightness is detected using the output voltage obtained is known (For example, see Reference 1: Japanese Published Patent Application No. 2005-129909).

SUMMARY OF THE INVENTION

When illuminance is low, a current generated in a photoelectric conversion element is weak. Therefore, in the case of outputting a signal which is detected by the photoelectric conversion element to an external equipment, an amplifier circuit or the like needs to be provided at an output portion of the photoelectric conversion element, and capability of driving the external equipment is needs to be enhanced. Specifically, leakage current or noise which is caused when the photoelectric conversion device provided with a photoelectric conversion element is electrically connected to another external circuit, in particular over a printed wiring board, becomes problems.

In addition, in the photoelectric conversion device provided with a photoelectric conversion element described in Reference 1, photocurrent $I_{pd}$ which flow through the photoelectric conversion element in accordance with the incident light increases exponentially with respect to the illuminance. Therefore, the output voltage obtained in such a manner that the photocurrent $I_{pd}$ is flowed through a resistor element also increases exponentially. Therefore, there has been a problem in that a range of illuminance which can be input from the photoelectric conversion device provided with a photoelectric conversion element cannot be set widely when the output voltage is defined with a range of practical voltage output to an AD conversion circuit (for example, 0.008 V to 2 V). In addition, in the photoelectric conversion device provided with a photoelectric conversion element described in Reference 1, there has been a problem in that an external circuit such as load resistor or the like is additionally needed when the output value is to be obtained as the voltage.

In order to solve the above-described problems, it is an object of the present invention to provide a photoelectric conversion device which can solve the problem of leakage current or noise caused when the photoelectric conversion device is electrically connected to an external circuit by amplifying the current flowing through the photoelectric conversion element, and which can widen the dynamic range of the output voltage which is obtained in accordance with the current flowing through the photoelectric conversion element.

In order to attain the above-described object, a photoelectric conversion device of the present invention includes a voltage detection circuit, and a photoelectric conversion circuit including a photoelectric conversion element, a current mirror circuit, and a field effect transistor. The current mirror circuit is a circuit which amplifies and outputs the photocurrent generated at the photoelectric conversion element. An output terminal which outputs the photocurrent amplified at the current mirror circuit is electrically connected to a drain terminal and a gate terminal of the field effect transistor. The voltage detection circuit is electrically connected to the gate terminal of the field effect transistor so as to detect generated voltage.

By the photoelectric conversion device of the present invention, leakage current or noise caused when the photoelectric conversion device is electrically connected to an external circuit can be reduced by amplifying the current flowing through the photoelectric conversion element, and the dynamic range of the output voltage which is obtained in accordance with the current flowing through the photoelectric conversion element can be widened.

Figure 1:
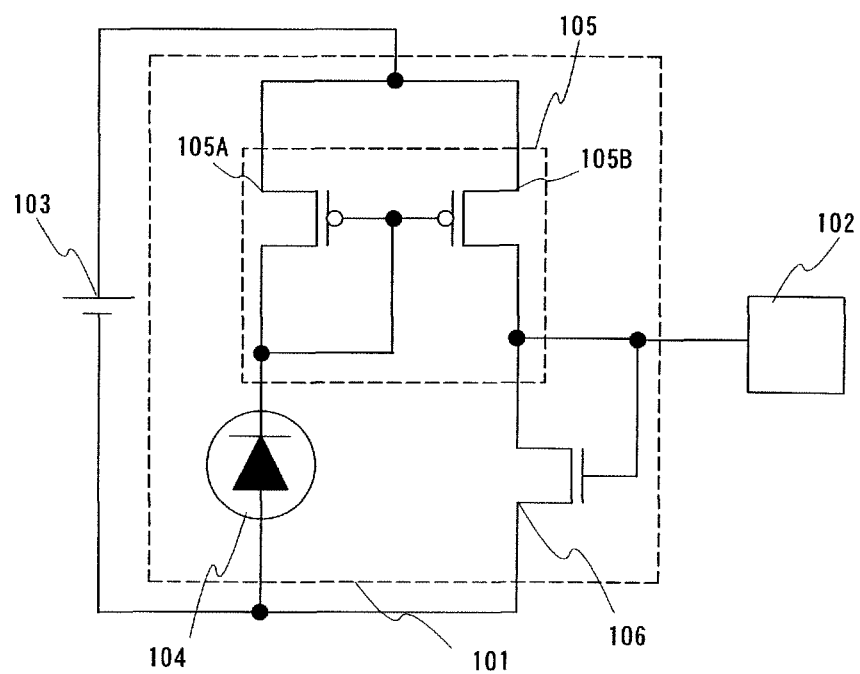
FIG. 1 is a diagram showing Embodiment Mode 1 of the present invention.

Hereinafter, embodiment modes of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes. Through the drawings of the embodiment modes, the same components or components having similar functions are denoted by the same reference numerals and will not be further explained.

[Embodiment Mode 1]

This embodiment mode will be described with reference to FIG. 1. A photoelectric conversion device shown in FIG. 1 includes a photoelectric conversion circuit 101, a voltage detection circuit 102, and a DC power supply 103. The photoelectric conversion circuit 101 includes a photoelectric conversion element 104, a current mirror circuit 105, and an n-channel transistor 106. The current mirror circuit 105 includes a first p-channel transistor 105A and a second p-channel transistor 105B. A first terminal (also referred to as an input terminal) which is an anode of the photoelectric conversion element 104 is electrically connected to a low voltage terminal (also referred to as a second terminal) of the DC power supply 103. In addition, a second terminal (also referred to as an output terminal) which is a cathode of the photoelectric conversion element 104 is electrically connected to a drain terminal and a gate terminal of the first p-channel transistor 105A, and a gate terminal of the second p-channel transistor 105B. In addition, each source terminal of the first p-channel transistor 105A and the second p-channel transistor 105B is electrically connected to a high voltage terminal (also referred to as a first terminal) of the DC power supply 103. In addition, a drain terminal of the second p-channel transistor 105B is electrically connected to a drain terminal and a gate terminal of the n-channel transistor 106, and the voltage detection circuit 102. In addition, a source terminal of the n-channel transistor 106 is electrically connected to the second terminal of the DC power supply 103. Note that the reverse bias voltage is applied to the photoelectric conversion element 104 by the DC power supply 103.

The operation of the photoelectric conversion circuit 101 shown in FIG. 1 is described. In the photoelectric conversion circuit 101, a photocurrent $I_p$ is generated corresponding to the intensity of light which enters the photoelectric conversion element 104. Then, the photocurrent $I_p$ generated at the photoelectric conversion element 104 flows between the source terminal and the drain terminal of the first p-channel transistor 105A, whereby a potential difference is caused between the gate terminal and the source terminal of the first p-channel transistor 105A. The potential difference is also applied between the source terminal and the drain terminal of the second p-channel transistor 105B. The second p-channel transistor 105B can amplify the photocurrent $I_p$ by changing design of a gate width of the second p-channel transistor. The photocurrent $I_p$ which is amplified flows between the drain terminal and the source terminal of the n-channel transistor 106, so that voltage which is applied between the gate terminal and the source terminal (hereinafter, abbreviated as gate voltage $V_{gs}$) is generated at the n-channel transistor 106 corresponding to the photocurrent $I_p$ which is amplified. The source terminal of the n-channel transistor 106 is electrically connected to a low potential terminal of the DC power supply 103, and potential of the gate terminal of the n-channel transistor 106 can be taken out as output voltage $V_{out}$. Therefore, the photoelectric conversion circuit 101 can conduct current-voltage conversion of the photocurrent $I_p$ which is amplified and the output voltage $V_{out}$, that is, current-voltage conversion of the photocurrent $I_p$ and the output voltage $V_{out}$. In the present invention, current-voltage conversion of the photocurrent $I_p$ and the output voltage $V_{out}$ is conducted with amplified photocurrent; thus the problem of the leakage current or noise caused when a photoelectric conversion device is electrically connected to an external circuit over a printed wiring board can be solved.

Figure 2:
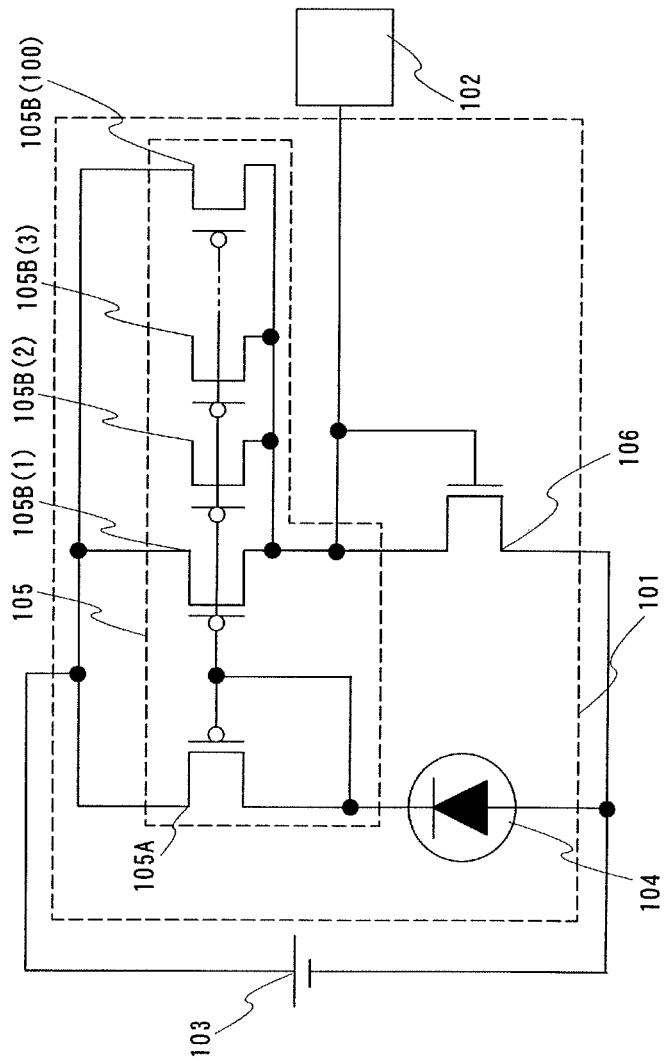
FIG. 2 is a diagram showing Embodiment Mode 1 of the present invention.

Note that specific circuit structure of the current mirror circuit 105 when the photocurrent $I_p$ of the photoelectric conversion element 104 is amplified is described with reference to FIG. 2. In the case where the output value of the photocurrent $I_p$ is made N times (N is a natural number) by the current mirror circuit 105, one first p-channel transistor 105A and N second p-channel transistors 105B which are connected in parallel may be provided in the current mirror circuit 105. As an example, FIG. 2 illustrates the current mirror circuit 105 in which one first p-channel transistor 105A and 100 second p-channel transistors 105B connected in parallel are provided, in the case where the output value of the photocurrent $I_p$ is made 100 times by the current mirror circuit 105. In FIG. 2, the second p-channel transistors 105B include the p-channel transistors 105B (1), 105B (2), 105B (3), . . . , 105B (100). Therefore, the photocurrent $I_p$ generated at the photoelectric conversion element 104 can be amplified 100 times to output.

Note that it is preferable to employ a structure in which a p-channel transistor is used as each of the first p-channel transistor 105A and the second p-channel transistor 105B included in the current mirror circuit 105 because the photocurrent $I_p$ can be amplified without being affected by threshold voltage of a transistor, when the structure is used. In other words, a rise of the voltage at a drain terminal of the second p-channel transistor by influence of the threshold voltage of the transistor can be prevented.

Note that the output voltage $V_{out}$ which is generated in such a manner that the photocurrent $I_p$ amplified by the current mirror circuit 105 flows between the source terminal and the drain terminal of the n-channel transistor 106 depends on a state of the operation of the n-channel transistor 106. The state of the operation of the n-channel transistor 106 can be described with a state of the operation of the field effect transistor. Examples of the field effect transistor include a metal oxide semiconductor field effect transistor (hereinafter, referred to as a MOS transistor or a transistor), an insulated gate type FET, a thin film transistor, and the like. In this specification, an operation of a MOS transistor as a field effect transistor will be described in detail below. When the MOS transistor operates in a saturation region, relations of a drain current $I_d$ and the gate voltage $V_{gs}$ are expressed by Equation 1 and Equation 2.

$$Id = \frac{\beta(Vgs - Vth)^2}{2} \quad \text{Equation 1}$$

$$\beta = \frac{\mu CoxW}{L} \quad \text{Equation 2}$$

In Equation 1, $V_{th}$ is threshold voltage of the MOS transistor, and β is a constant which is determined depending on size and process conditions of the MOS transistor. In addition, in Equation 2, W represents the gate width of the MOS transistor, L represents the gate length of the MOS transistor, μ represents electron mobility in a semiconductor layer, and Cox represents gate capacitance which is generated in a stacked structure in which an insulating film is sandwiched between the semiconductor layer and the gate electrode.

The output voltage $V_{out}$ in the circuit shown in FIG. 1 of this embodiment mode can be treated as the gate voltage $V_{gs}$ in Equation 1. The photocurrent $I_p$ which is amplified by the current mirror circuit 105 in the circuit of FIG. 1 can be treated as a drain current $I_d$ in Equation 1. Accordingly, by transforming Equation 1, the relation between the photocurrent $I_p$ which is amplified by the current mirror circuit 105 and the output voltage $V_{out}$ can be expressed by Equation 3.

$$Vout = \sqrt{\frac{2Ip}{\beta}} + Vth \quad \text{Equation 3}$$

Note that in the case of the n-channel transistor 106 which is diode-connected shown in FIG. 1, the voltage applied between the drain terminal and the source terminal (hereinafter, abbreviated as drain voltage $V_{ds}$) is equivalent to the gate voltage $V_{gs}$. Therefore, when the drain current $I_d$ increases, the output voltage $V_{out}$ of the photoelectric conversion device shown in this embodiment mode can be obtained in the form of the square root of the photocurrent $I_p$ which is amplified by the current mirror circuit 105. Then, the dynamic range of detectable input illuminance of the photoelectric conversion device of the present invention can be widened compared to the case where the photocurrent $I_p$ generated in the photoelectric conversion element flows through the load resistor to obtain the voltage output. In addition, in the photoelectric conversion device of the present invention, the problem of the leakage current or noise caused when the photoelectric conversion device is electrically connected to an external circuit over a printed wiring board can be solved by using amplified photocurrent.

In addition, an n-channel transistor is used in a photoelectric conversion device of the present invention as the transistor which is diodes-connected to obtain the output voltage.

Figure 3:
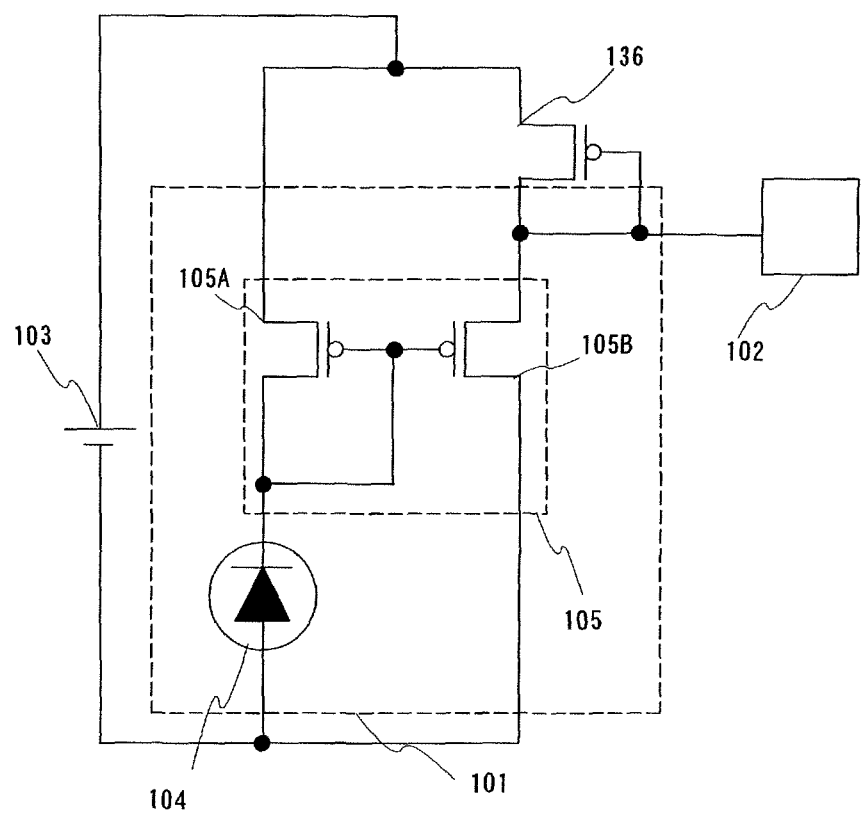
FIG. 3 is a diagram showing Embodiment Mode 1 of the present invention.

Since the mobility of the n-channel transistor is higher than that of the p-channel transistor and the amount of current which flows through the transistor can be increased, the n-channel transistor is preferable. Note that a p-channel transistor may also be used in a photoelectric conversion device of the present invention as the transistor which is diodes-connected to obtain the output voltage. FIG. 3 illustrates a photoelectric conversion device in which a p-channel transistor is used as the transistor which is diodes-connected to obtain the output voltage. The photoelectric conversion device shown in FIG. 3 is different from that of in FIG. 1 in that a third p-channel transistor 136 is added as a diode-connected transistor. As for the third p-channel transistor, a source terminal is electrically connected to the high voltage terminal of the DC power supply 103, and a gate terminal and a drain terminal are electrically connected to the source terminal of the second p-channel transistor. As shown in FIG. 3, since the present invention can be manufactured with only MOS transistors having one polarity by using a p-channel transistor as a diode-connected transistor, the number of masks and the period of the manufacturing process can be reduced compared to a structure that uses a photoelectric conversion device including an operational amplifier or the like, whereby cost can be reduced. In addition, since the MOS transistors which are field effect transistors included in the photoelectric conversion device are formed with thin film transistors, so that the size of the device can be reduced. Miniaturization of a part like an optical sensor provided with a photoelectric conversion device is effective particularly when the component is used for portable electronic devices.

In addition in FIG. 1, when the photoelectric conversion element 104 is irradiated with low illuminance light, amplified photocurrent $I_p$ enough for operating the n-channel transistor 106 in a saturation region is not supplied from the current mirror circuit 105 to the n-channel transistor 106 in some cases. When amplified photocurrent $I_p$ enough for operating the n-channel transistor 106 in the saturation region is not supplied, the n-channel transistor 106 operates in a subthreshold (weak inversion) region. The relation between the drain current $I_d$ and the gate voltage $V_{gs}$ of the MOS transistor at the operation in the subthreshold region is expressed by the following Equations 4, 5 and 6.

$$Id = Idd\exp\left[\frac{q}{nkT}(Vgs - Vth)\right] \quad \text{Equation 4}$$

$$Idd = \frac{W\mu Cox}{nL}\left(\frac{nkT}{q}\right)^2 \exp(-1) \quad \text{Equation 5}$$

$$n = \frac{Cox + Cd}{Cox} \quad \text{Equation 6}$$

In Equations 4, 5 and 6, k represents a Boltzmann constant, T represents a temperature of the semiconductor layer, q represents an elementary electric charge in the semiconductor layer, and Cd represents capacitance of depletion layer in the semiconductor layer.

The output voltage $V_{out}$ in the circuit shown in FIG. 1 of this embodiment mode can be treated as the gate voltage $V_{gs}$ in Equation 4. The photocurrent $I_p$ in the circuit of FIG. 1 can be treated as a drain current $I_d$ in Equation 4. Accordingly, by transforming Equation 4, the relation of the photocurrent $I_p$ and the output voltage $V_{out}$ can be expressed by Equation 7.

$$Vout = Vth + \frac{nkT}{q}\ln\left(\frac{Ip}{Idd}\right) \qquad \text{Equation 7}$$

As shown in Equation 7, the output voltage $V_{out}$ of the photoelectric conversion device shown in this embodiment mode can be obtained in the form of the logarithm of the photocurrent $I_p$. Then, as for the photoelectric conversion device of the present invention, the photocurrent $I_p$ generated at the photoelectric conversion element is amplified by the current mirror circuit, so that leakage current or noise caused when the photoelectric conversion element is electrically connected to an external circuit can be reduced and the dynamic range of the output voltage which can be obtained in accordance with the current flows through the photoelectric conversion element can be widened.

Note that detection of the output voltage $V_{out}$ using the n-channel transistor 106 of the photoelectric conversion device shown in FIG. 1 may be conducted in either case of using the operation in the saturation region or using the operation in the subthreshold region, and it is not limited to one of the detections.

Figure 4:
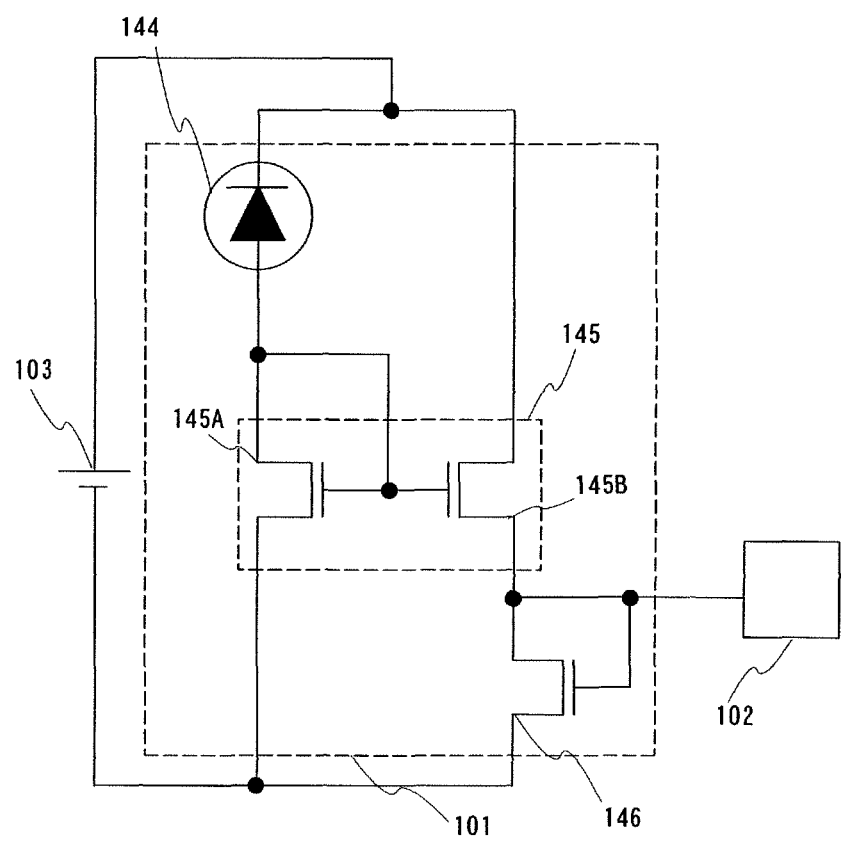
FIG. 4 is a diagram showing Embodiment Mode 1 of the present invention.

Note that, in the photoelectric conversion device shown in FIG. 1, a structure where the polarity of the transistor included in the current mirror circuit is a p-channel transistor is shown; however, the present invention can also employ an n-channel transistor. FIG. 4 illustrates a photoelectric conversion device in which an n-channel transistor is used as a transistor included in the current mirror circuit, differently from the current mirror circuit 105 illustrated in FIG. 1. The photoelectric conversion device illustrated in FIG. 4 includes the photoelectric conversion circuit 101, the voltage detection circuit 102, and the DC power supply 103. The photoelectric conversion circuit 101 includes a photoelectric conversion element 144, a current mirror circuit 145, and a third n-channel transistor 146. The current mirror circuit 145 includes a first n-channel transistor 145A and a second n-channel transistor 145B. A second terminal which is a cathode of the photoelectric conversion element 144 is electrically connected to the high voltage terminal of the DC power supply 103. In addition, a first terminal which is an anode of the photoelectric conversion element 144 is electrically connected to a drain terminal and a gate terminal of the first n-channel transistor 145A and a gate terminal of the second n-channel transistor 145B. In addition, a source terminal of the first n-channel transistor 145A is electrically connected to the low voltage terminal of the DC power supply 103. In addition, a drain terminal of the second n-channel transistor 145B is electrically connected to the high voltage terminal of the DC power supply 103. In addition, a source terminal of the second n-channel transistor 145B is electrically connected to a drain terminal and a gate terminal of the third n-channel transistor 146 and the voltage detection circuit 102. In addition, a source terminal of the third n-channel transistor 146 is electrically connected to the low voltage terminal of DC the power supply 103. Note that the reverse bias voltage is applied to the photoelectric conversion element 144 by the DC power supply 103.

As shown in FIG. 4, since the present invention can be manufactured with only MOS transistors having one polarity by using n-channel transistors as a transistor included in the current mirror circuit and a diode-connected transistor, the number of masks and the period of a manufacturing process can be reduced compared to a structure that uses a photoelectric conversion device including an operational amplifier or the like, whereby cost can be reduced. In addition, since the MOS transistors which are field effect transistors included in the photoelectric conversion device are formed with a thin film transistor, so that the size of the device can be reduced. Miniaturization of a part like an optical sensor provided with a photoelectric conversion device is effective particularly when the component is used for portable electronic devices.

Figure 5:
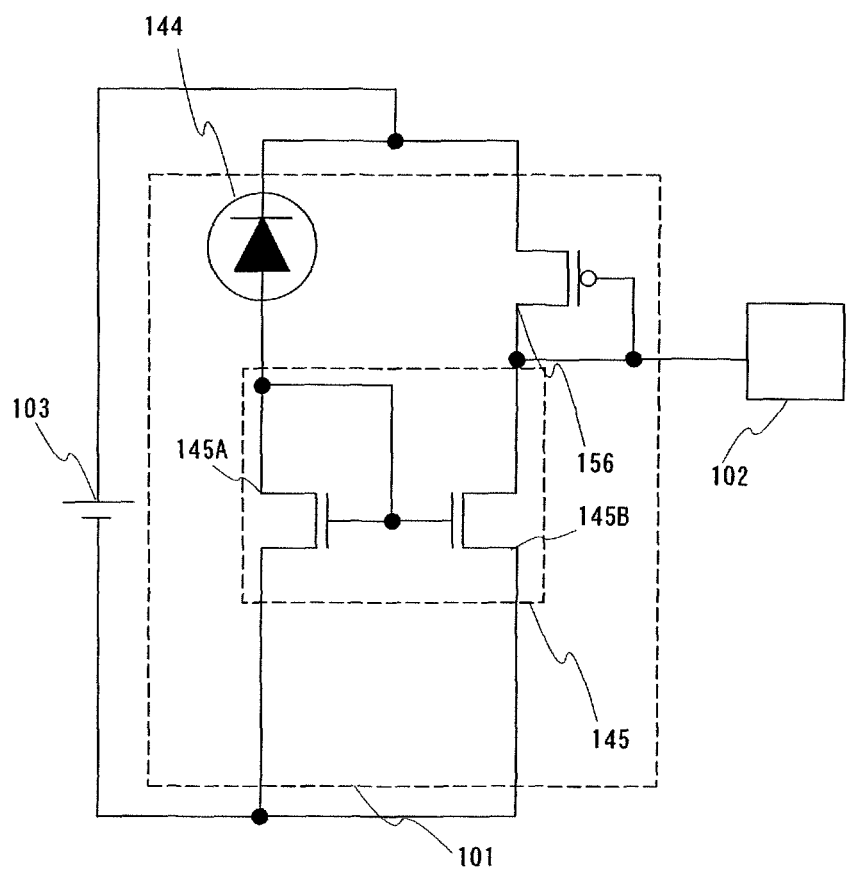
FIG. 5 is a diagram showing Embodiment Mode 1 of the present invention.

Note that a structure in which an n-channel transistor is used as a transistor included in the current mirror circuit and a p-channel transistor is used as a diode-connected transistor may be employed as a photoelectric conversion device which is different from those of FIGS. 1, 3 and 4. FIG. 5 illustrates a photoelectric conversion device in which an n-channel transistor is used as a transistor included in the current mirror circuit and a p-channel transistor is used as a diode-connected transistor. The photoelectric conversion device shown in FIG. 5 is different from that of FIG. 4 in that a p-channel transistor 156 is added as a diode-connected transistor. As for the p-channel transistor 156, a source terminal is electrically connected to the high voltage terminal of the DC power supply 103, and a gate terminal and a drain terminal are electrically connected to the source terminal of the second n-channel transistor 145B.

Note that as for the voltage detection circuit 102 which is mentioned in FIGS. 1 to 4, a structure may be employed, in which an AD converter or the like is provided separately as an external circuit so that the output voltage $V_{out}$ is detected. Note that the AD converter and the photoelectric conversion circuit 101 can also be formed using thin film transistors over the same substrate.

Various types of field effect transistors can be employed as the n-channel transistor and the p-channel transistor described in this embodiment mode. Therefore, there is no limitation to the kinds of transistors to be used. For example, a thin film transistor (a TFT) including a film of non-single crystalline semiconductor typified by amorphous silicon, polycrystalline silicon, microcrystalline (also referred to as semi-amorphous) silicon, or the like can be employed. In the case of using the TFT, there are various advantages. For example, since the TFT can be formed at a temperature lower than that of the case of using single crystalline silicon, manufacturing cost can be reduced and a manufacturing device can be made larger. Since the manufacturing device can be made larger, the TFT can be formed using a large substrate. Therefore, since many photoelectric conversion devices can be formed at the same time, the TFT can be formed at low cost. In addition, a substrate having low heat resistance can be used because of low manufacturing temperature. Therefore, the transistor can be formed over a light-transmitting substrate. Further, transmission of light in a photoelectric conversion element can be controlled by using the transistor formed over the light-transmitting substrate.

Note that by using a catalyst (e.g., nickel) in the case of forming polycrystalline silicon, crystallinity can be further improved, and a transistor having excellent electric characteristics can be formed. As a result, a circuit which is required to operate at a high speed can be formed over the one substrate. Note that by using a catalyst (e.g., nickel) in the case of forming microcrystalline silicon, crystallinity can be further improved and a transistor having excellent electric characteristics can be formed. At this time, crystallinity can be improved by performing heat treatment without laser irradiation. In the case of not using a laser for crystallization, crystallinity unevenness of silicon can be suppressed. Therefore, variation in characteristics among transistors can be reduced. Note that polycrystalline silicon and microcrystalline silicon can be formed without using a catalyst (e.g., nickel).

In addition, transistors can be formed by using a semiconductor substrate, an SOI substrate, or the like. Therefore, transistors with little variations in characteristics, size, shape, or the like, with high current supply capacity, and with a small size can be formed. By using such transistors, power consumption of a circuit can be reduced or a circuit can be highly integrated.

In addition, a transistor including a compound semiconductor or an oxide semiconductor such as ZnO, a-InGaZnO, SiGe, GaAs, IZO, ITO, or SnO, and a thin film transistor or the like obtained by thinning such the compound semiconductor or the oxide semiconductor can be used. Therefore, manufacturing temperature can be lowered and for example, a transistor can be formed at room temperature. Accordingly, the transistor can be formed directly on a substrate having low heat resistance such as a plastic substrate or a film substrate.

A transistor or the like formed by using an inkjet method or a printing method can also be used. Accordingly, a transistor can be formed at room temperature, can be formed at a low vacuum, or can be formed using a large substrate. In addition, since the transistor can be formed without using a mask (a reticle), layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, a transistor including an organic semiconductor or a carbon nanotube, or the like can resist a shock.

Various types of field effect transistors can be used and be formed over various types of substrates. Accordingly, all of the circuits which are necessary to realize a given function can be formed over the same substrate. For example, all of the circuits which are necessary to realize a given function can be formed over a glass substrate, a plastic substrate, a single crystalline substrate, an SOI substrate, or any of the other substrates. Note that the photoelectric conversion device of this embodiment mode can be formed over a light-transmitting substrate such as a glass substrate by forming a field effect transistor using a thin film transistor. Therefore, when the photoelectric conversion element 104 is formed over the substrate, not only the light from top surface side but also the light transmitted through the substrate from the rear side of the substrate can be received by the photoelectric conversion element 104, whereby it is effective to enhance the efficiency of light reception.

Note that this embodiment mode can be implemented by being combined with any technical elements in other embodiment modes of this specification.

[Embodiment Mode 2]

Embodiment Mode 2 of the present invention, which has a different structure from the photoelectric conversion device described in the above embodiment mode, will be described with reference to FIG. 6. A photoelectric conversion device described in this embodiment mode includes the photoelectric conversion circuit 101, the voltage detection circuit 102, the DC power supply 103, and a buffer 201. The difference from the photoelectric conversion device described with reference to FIG. 1 in Embodiment Mode 1 is that the buffer 201 is included between the photoelectric conversion circuit 101 and the voltage detection circuit 102. As a specific structure of the buffer 201, it is preferable to use an operational amplifier which is electrically connected in order to operate as a voltage-follower. A noninverting input terminal of the operational amplifier which is an input terminal of the buffer 201 is electrically connected to a gate terminal and a drain terminal of the diode-connected n-channel transistor 106 and a drain terminal of the second p-channel transistor 105B which is included in the current mirror circuit. In addition, an output terminal of the operational amplifier which is an output terminal of the buffer 201 is electrically connected to the inverting input terminal of the operational amplifier and the voltage detection circuit 102. Note that the buffer 201 is not limited to a structure in which the operational amplifier is used, and the structure may be employed in which an inverter or an amplifier is used.

Figure 6:
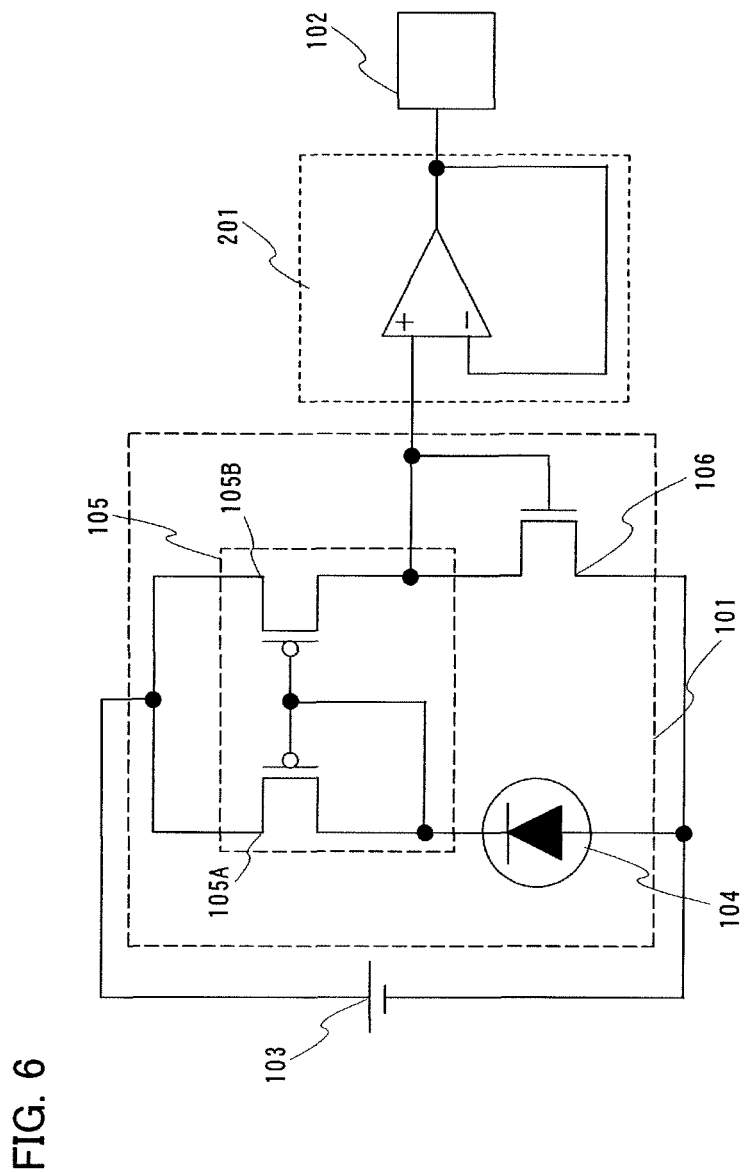
FIG. 6 is a diagram showing Embodiment Mode 2 of the present invention.

The photoelectric conversion device described in the this embodiment mode as shown in FIG. 6 is provided with the buffer 201 at an output portion of the photoelectric conversion circuit shown in FIG. 1, that is, specifically the operational amplifier, each terminal of which is electrically connected in such a manner that the amplification factor is one and which operates as a voltage-follower is provided. By providing the buffer 201, the present invention is not easily affected by noise when a photoelectric conversion device is mounted over the printed wiring board.

Note that FIG. 6 illustrates the structure in which a p-channel transistor is used as each of transistors of the current mirror circuit included in the photoelectric conversion device and an n-channel transistor is used as a diode-connected transistor; however, even when a transistor having the other polarity is used for the current mirror circuit and the diode-connected transistor as shown in FIGS. 2, 4, and 5 described in Embodiment Mode 1, the same effect as that of the structure of this embodiment mode is produced.

Note that this embodiment mode can be implemented by being combined with any technical elements in other embodiment modes of this specification.

[Embodiment Mode 3]

Figure 7:
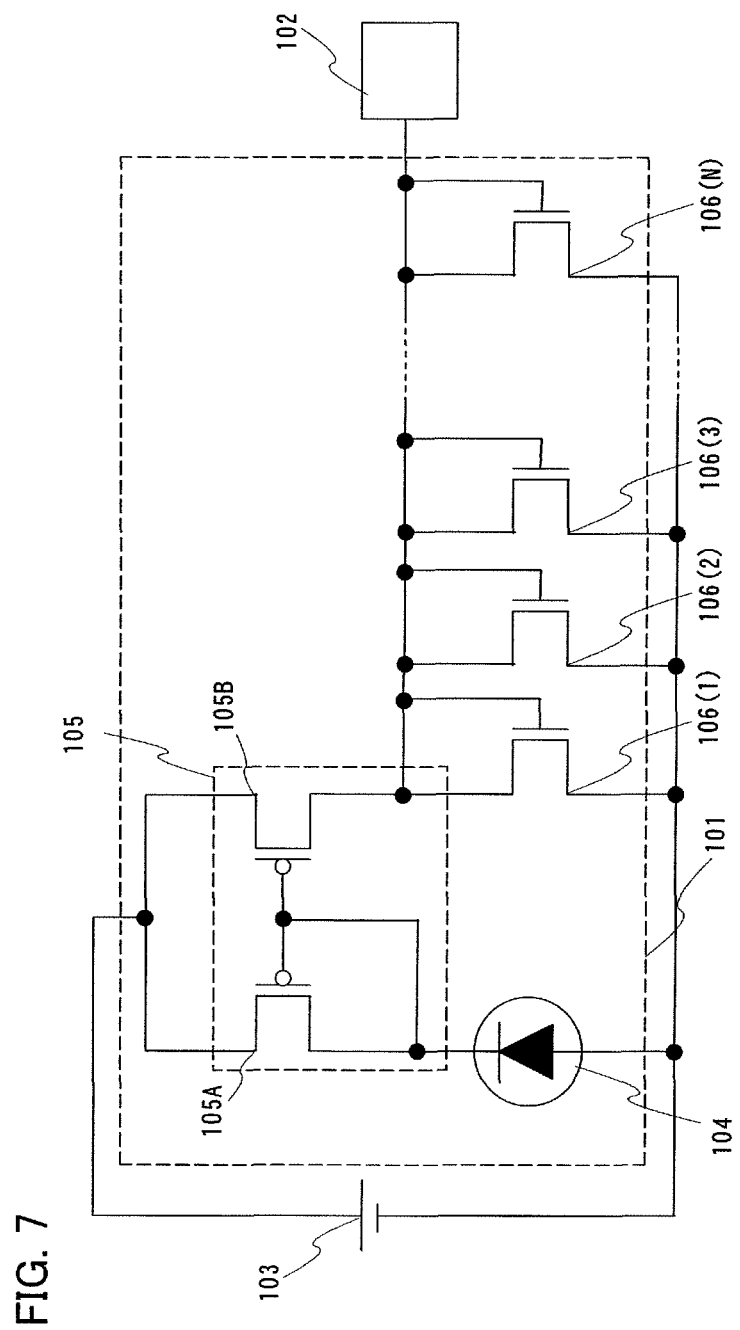
FIG. 7 is a diagram showing Embodiment Mode 3 of the present invention.

Embodiment Mode 3 of the present invention will be described with reference to FIG. 7. This embodiment mode differs from the photoelectric conversion device of Embodiment Mode 1 in FIG. 1 in that a plurality of n-channel transistors 106, such as the n-channel transistors 106 (1), 106 (2), 106 (3), . . . , 106 (N) (N is a natural number), are included in the photoelectric conversion device shown in this embodiment mode while one diode-connected n-channel transistor 106 is included in the photoelectric conversion device in FIG. 1.

The n-channel transistor 106 is a circuit for converting the photocurrent $I_p$ which is amplified by the current mirror circuit into the output voltage $V_{out}$ in the photoelectric conversion circuit 101, and the characteristics of the n-channel transistor 106 may vary due to various factors in the manufacturing steps in some cases. Even when the same amount of the photocurrent $I_p$ is input, the level of the output voltage $V_{out}$ changes due to the variation of the characteristics, and there is a possibility of a problem that the photoelectric conversion device with high yield cannot be manufactured. Thus, the n-channel transistor 106 included in the photoelectric conversion device is provided with a plurality of the n-channel transistors 106 (1), 106 (2), 106 (3), . . . , 106 (N) as shown in this embodiment mode, so that the percentage of the effect on the output voltage $V_{out}$ from the variation of one n-channel transistor can be small. Therefore, the yield in manufacturing the photoelectric conversion device can be increased.

Figure 8:
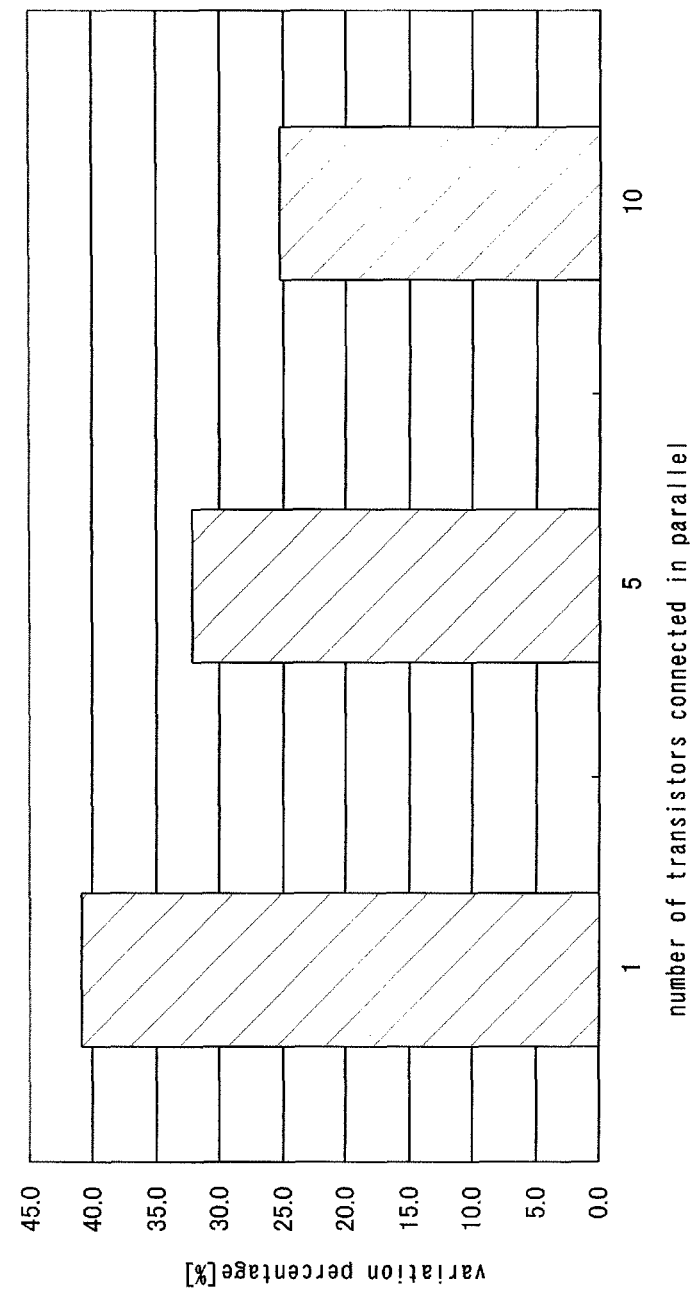
FIG. 8 is a characteristic diagram of Embodiment Mode 3 of the present invention.

As one example, FIG. 8 is a characteristic diagram, showing a case where threshold voltage of the diode-connected n-channel transistor 106 varies ±0.1 V at most is simulated in each case that the number of the n-channel transistor 106 included in the photoelectric conversion device is one, five in parallel connection, and 10 in parallel connection, and how much the output voltage $V_{out}$ changes at most at illuminance 100 1×, is compared based on the deviation from the median of the output voltage $V_{out}$. As shown in FIG. 8, when the diode-connected n-channel transistor 106 is only one, the output voltage $V_{out}$ varies approximately 40% at most from the median. On the other hand, when five diode-connected n-channel transistors 106 are connected in parallel, the variation percentage is approximately 32%, and when ten diode-connected n-channel transistor 106 are connected in parallel, the variation percentage is approximately 25%; thus, the variation can be gradually reduced. Therefore, by providing the plurality of the n-channel transistors 106 connected in parallel, the variation of the output voltage $V_{out}$ due to the characteristic variation generated in manufacturing can be suppressed.

Note that this embodiment mode can be implemented by being combined with any technical elements in other embodiment modes of this specification.

[Embodiment Mode 4]

This embodiment mode will describe a manufacturing method of the field effect transistor included in the photoelectric conversion device and the photoelectric conversion element described in the above embodiment mode as an example using cross sectional views. Description is made with reference to FIGS. 9A to 10C.

First, a substrate (a first substrate 310) over which a photoelectric conversion element and a field effect transistor (hereinafter, simply referred to as a transistor) are to be formed is prepared. In this embodiment mode, AN 100, which is one of glass substrates, is used as the substrate 310. A thin film transistor is used as a field effect transistor formed over the substrate so that a photoelectric conversion element and a thin film transistor can be formed over the substrate in the same process; therefore, there is an advantage that the photoelectric conversion device is easy to be produced in large quantities.

Next, a silicon oxide film containing nitrogen (with a film thickness of 100 nm) to be a base insulating film 312 is formed by a plasma CVD method, and a semiconductor film such as an amorphous silicon film containing hydrogen (with a film thickness of 54 nm) is stacked thereover without being exposed to atmospheric air. In addition, the base insulating film 312 may be formed by stacking a silicon oxide film, a silicon nitride film, and a silicon oxide film containing nitrogen. For example, films in which a silicon nitride film containing oxygen with a film thickness of 50 nm and a silicon oxide film containing nitrogen with a film thickness of 100 nm are stacked may be formed as the base insulating film 312. Note that the silicon oxide film containing nitrogen and the silicon nitride film serve as a blocking layer that prevents an impurity such as an alkali metal or the like from diffusing from the glass substrate.

Then, the amorphous silicon film is crystallized by a know technique (a solid-phase growth method, a laser crystallization method, a crystallization method using a catalytic metal, or the like) to form a semiconductor film having a crystalline structure (a crystalline semiconductor film), for example, a polycrystalline silicon film. Here, a polycrystalline silicon film is obtained by a crystallization method using a catalytic element. A nickel acetate solution containing nickel of 10 ppm by weight is added by a spinner. Note that a nickel element may be dispersed over the entire surface by a sputtering method instead of a method adding the solution. Then, heat treatment is performed for crystallization to form a semiconductor film (here, polycrystalline silicon) having a crystalline structure. Here, the heat treatment (at 500° C. for one hour) is performed. After that, a polycrystalline silicon film is obtained by heat treatment for crystallization (at 550° C. for 4 hours).

Next, an oxide film over the surface of the polycrystalline silicon film is removed by a dilute hydrofluoric acid or the like. After that, in order to increase a crystallization rate and repair defects left in crystal grains, irradiation with laser light (XeCl: wavelength of 308 nm) is performed in the atmosphere or the oxygen atmosphere.

As the laser light, excimer laser light with a wavelength of 400 nm or less; or a second harmonic or a third harmonic of a YAG laser is used. Here, pulsed laser light with a repetition frequency of approximately 10 to 1000 Hz is used, the pulsed laser light is condensed to 100 to 500 mJ/cm² by an optical system, and irradiation is performed with an overlap rate of 90 to 95%, whereby the surface of the silicon film may be scanned. In this embodiment mode, irradiation with laser light having a repetition frequency of 30 Hz and energy density of 470 mJ/cm² is performed in the atmosphere.

Note that since laser light irradiation is performed in an atmospheric air or in an oxygen atmosphere, an oxide film is formed on the surface by the laser light irradiation. Note that although an example in which the pulsed laser is used is shown in this embodiment mode, a continuous wave laser may be used instead. In order to obtain crystal with large grain size at the time of crystallization of a semiconductor film, it is preferable to use a solid laser which is capable of continuous oscillation and to apply the second to fourth harmonic of a fundamental wave. Typically, a second harmonic (532 nm) or a third harmonic (355 nm) of an Nd: YVO₄ laser (a fundamental wave of 1064 nm) may be applied.

In the case of using a continuous wave laser, laser light which is emitted from a continuous wave YVO₄ laser of 10 W output is converted into a harmonic by a non-linear optical element. Alternatively, there is a method by which YVO₄ crystal and a non-linear optical element are put in a resonator and a high harmonic is emitted. Then, the laser light having a rectangular shape or an elliptical shape on an irradiated surface is preferably formed by an optical system to be emitted to an object to be processed. At this time, a power density of approximately 0.01 to 100 MW/cm² (preferably, 0.1 to 10 MW/cm²) is necessary. Then, the semiconductor film may be moved at a rate of approximately 10 to 2000 cm/s relatively to the laser light so as to be irradiated.

Subsequently, in addition to the oxide film which is formed by the above laser light irradiation, a barrier layer formed of an oxide film having a thickness of 1 to 5 nm in total is formed by treatment to the surface with ozone water for 120 seconds. The barrier layer is formed in order to remove the catalytic element which is added for crystallization, for example, nickel (Ni), from the film. Although the barrier layer is formed using ozone water here, the barrier layer may be formed by deposition of an oxide film having a thickness of approximately 1 to 10 nm by a method of oxidizing a surface of the semiconductor film having a crystalline structure by UV-ray irradiation in an oxygen atmosphere; a method of oxidizing a surface of the semiconductor film having a crystalline structure by oxygen plasma treatment; a plasma CVD method; a sputtering method; an evaporation method; or the like. In addition, the oxide film formed by the laser light irradiation may be removed before formation of the barrier layer.

Then, an amorphous silicon film containing an argon element which serves as a gettering site is formed to be 10 to 400 nm thick, here 100 nm thick, over the barrier layer by a sputtering method. Here, the amorphous silicon film containing an argon element is formed under an atmosphere containing argon with the use of a silicon target. In a case where an amorphous silicon film containing an argon element is formed by a plasma CVD method, deposition conditions are as follows: a flow ratio of monosilane to argon ($SiH_4$:Ar) is 1:99, deposition pressure is set to be 6.665 Pa, RF power density is set to be 0.087 W/cm$^2$, and deposition temperature is set to be 350° C.

After that, heat treatment in a furnace heated at 650° C. is performed for 3 minutes to remove a catalytic element (gettering). Accordingly, concentration of the catalytic element in the semiconductor film having a crystalline structure is reduced. A lamp annealing apparatus may be used instead of the furnace.

Next, the amorphous silicon film containing an argon element, which is a gettering site, is removed as selected using the barrier layer as an etching stopper, and thereafter, the barrier layer is removed with a diluted hydrofluoric acid as selected. Note that nickel has a tendency to move to a region having high oxygen concentration at the time of gettering; therefore, it is preferable that the barrier layer formed of an oxide film is removed after gettering.

Note that, in a case where crystallization to the semiconductor film with the use of a catalytic element is not performed, the above steps such as forming the barrier layer, forming the gettering site, heat treatment for gettering, removing the gettering site, and removing the barrier layer are not necessary.

Figure 9A:
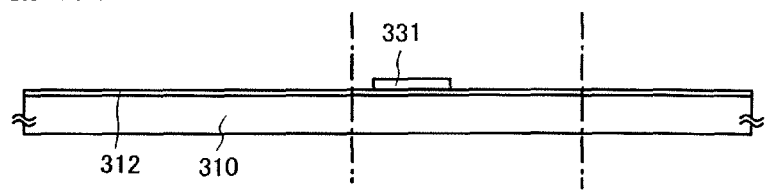
FIGS. 9A to 9D are views showing a manufacturing process of a photoelectric conversion device of the present invention.

Next, a thin oxide film is formed on the surface of the obtained semiconductor film having a crystalline structure (for example, a crystalline silicon film) with ozone water, and after that, a mask is formed of a resist using a first photomask and the semiconductor film is etched into a desired shape to form a semiconductor film (in this specification, referred to as "an island-shaped semiconductor region 331") that is separated into an island shape (see FIG. 9A). After the island-shaped semiconductor region 331 is formed, a mask formed of a resist is removed.

Note that as a manufacturing method of the island-shaped semiconductor region 331 shown in this embodiment mode, the island-shaped semiconductor region 331 can be manufactured by another manufacturing method without limiting to the above-mentioned manufacturing method. For example, the island-shaped semiconductor region 331 can be formed by using an SOI substrate. It is acceptable as long as a known SOI substrate is used as the SOI substrate, and a manufacturing method and a structure thereof are not particularly limited to certain types. Typical examples of the SOI substrate are a SIMOX substrate and a bonded substrate. In addition, examples of the bonded substrate are ELTRAN®, UNIBOND®, Smart Cut®, and the like.

In the case of a SIMOX substrate, an oxygen ion is introduced into a single crystal silicon substrate and heat treatment is performed at 1300° C. or higher to form a buried oxide film (BOX) layer, so that a thin film silicon layer is formed on the surface and an SOI structure can be obtained. The thin film silicon layer is insulated from the single crystal silicon substrate by the buried oxide film layer. Further, a technique referred to as ITOX (internal thermal oxidation-SIMOX) in which thermal oxidation is further performed after a buried oxide film layer is formed can also be used.

A bonded substrate is an SOI structure which is obtained in such a manner that two single crystal silicon substrates (a first single crystal silicon substrate and a second single crystal silicon substrate) are bonded with an oxide film layer interposed therebetween and one of the single crystal silicon substrates is thinned from a surface on the side which is opposite to the bonded side, so that a thin film silicon layer is formed on the surface. The oxide film layer can be formed by thermal oxidation of one of the substrates (here the first single crystal silicon substrate). In addition, the two single crystal silicon substrates can be bonded directly without using an adhesive agent.

Note that the bonded substrate may be formed in such a manner that a substrate having an insulating surface such as a glass substrate and single crystal substrate are bonded, without limiting to bonding two single crystal substrates. An SOI substrate in which a glass substrate and a single crystal substrate are bonded is described with reference to FIGS. 11A to 11D.

Figure 11A:
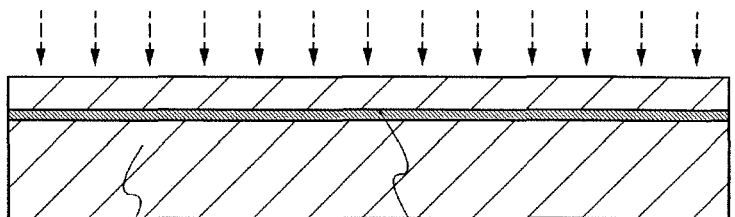
FIGS. 11A to 11D are views showing an example of a manufacturing process of a photoelectric conversion device of the present invention.

A single crystal substrate 1101 shown in FIG. 11A is cleaned and ions accelerated by an electric field from the surface are introduced at a predetermined depth to form an ion-doped layer 1103. Introduction of the ions is performed in consideration of a thickness of a semiconductor film which is to be transferred to a base substrate. The thickness of the semiconductor film is set to be 5 nm to 500 nm, preferably 10 nm to 200 nm, more preferably 10 nm to 100 nm, and further preferably, 10 nm to 50 nm. An accelerating voltage when the ions are introduced in the single crystal substrate 1101 is set in consideration of such a thickness. Note that, since a surface of the semiconductor film is planarized by polishing or melting after separation, the thickness of the semiconductor film right after separation is preferably set to be 50 nm to 500 nm.

The ion-doped layer 1103 is formed by introduction of ions of hydrogen, helium, or a halogen typified by fluorine. In this case, it is preferable to introduce ions formed of one or a plurality of the same atoms which have different masses. When hydrogen ions are introduced, it is preferable to include $H^+$, $H_2^+$, and $H_3^+$ ions, and to raise a percentage of $H_3^+$ ions. When hydrogen ions are introduced, $H^+$, $H_2^+$, and $H_3^+$ ions are included, and a percentage of $H_3^+$ ions is raised, whereby the introduction efficiency can be increased and introduction time can be shortened. By the above-described structure, separation at the ion-doped layer 1103 which is to be conducted later can be easily performed.

When the ions are introduced into the single crystal substrate 1101, the ions need to be introduced at high dose condition. Therefore, the surface of the single crystal substrate 1101 becomes rough in some cases. Therefore, a protective layer against the ion introduction such as a silicon oxide layer, a silicon nitride layer, a silicon nitride oxide layer, or the like is provided to have a thickness of 50 nm to 200 nm on the surface where the ions are to be introduced, whereby the surface can be prevented from being damaged and from losing its flatness by ion doping, which is preferable.

Figure 11B:
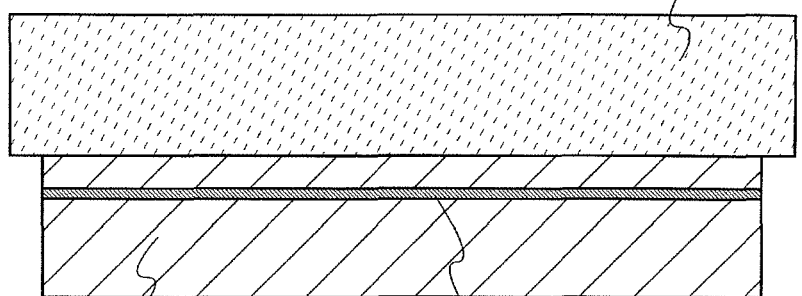

Next, as shown in FIG. 11B, a pressure member 1122 is provided on the surface of the single crystal substrate 1101, and the single crystal substrate 1101 and the pressure member 1122 are disposed in close contact with each other and heated. That is, heat treatment and pressure treatment are performed, whereby the single crystal substrate 1101 can be easily separated from the glass substrate 1100 using the ion-doped layer 1103 as a cleavage plane in a later process. The temperature of heat treatment is lower than a temperature at which the ion-doped layer 1103 is cleaved and is preferably a temperature at which the ion-doped layer 1103 becomes fragile. For example, heat treatment is performed at temperatures, lower than 400° C., preferably lower than 350° C., and lower preferably less than 300° C., whereby a change in the volume of fine voids formed in the ion-doped layer 1103 occurs. However, since the pressure member 1122 is provided on the surface of the single crystal substrate 1101, flatness of the surface of the single crystal substrate 1101 can be kept. As a result, distortion occurs in the ion-doped layer 1103 due to the change in the volume of the fine voids formed in the ion-doped layer 1103, so that the ion-doped layer 1103 can become fragile along the ion-doped layer. The pressure treatment is performed so that a pressure is applied perpendicular to a bonding surface in consideration of the pressure resistance of the glass substrate 1100 and the single crystal substrate 1101.

Figure 11C:
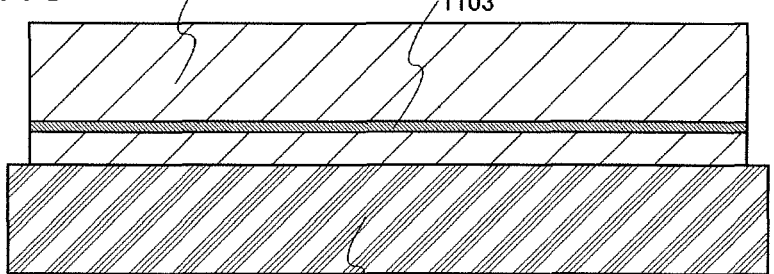

FIG. 11C shows a mode where the glass substrate 1100 is disposed in close contact with the single crystal substrate 1101 and the both substrates are bonded to each other. A surface that is to be bonded is cleaned sufficiently. Then, the glass substrate 1100 and the single crystal substrate 1101 are disposed in close contact with each other with a pressure applied, so that the glass substrate 1100 and the single crystal substrate 1101 are bonded to each other. The bond is formed by the effect of Van der Waals forces. The glass substrate 1100 and the single crystal substrate 1101 are disposed in close contact with each other with a pressure applied, whereby a stronger bond can be formed by hydrogen bonding.

In order to form a favorable bond, the surface is preferably activated. For example, the surface that is to be bonded is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Alternatively, at least one of bonding surfaces of a flexible substrate having an insulating surface and a single-crystal semiconductor layer may be subjected to treatment by oxygen plasma or washing with ozone water to be hydrophilic. Such surface treatment makes it easier to perform bonding between different kinds of materials even at temperatures of lower than 400° C.

Note that, instead of heat treatment which is performed before bonding the single crystal substrate 1101 to the glass substrate 1100, the single crystal substrate 1101 may be irradiated with a laser beam from the side of the glass substrate 1100 after bonding the single crystal substrate 1101 to the glass substrate 1100, and then the ion-doped layer 1103 may be heated. As a result, the ion-doped layer is becomes fragile and the single crystal substrate 1101 can be separated from the glass substrate 1100 using the ion-doped layer as a cleavage plane.

Figure 11D:
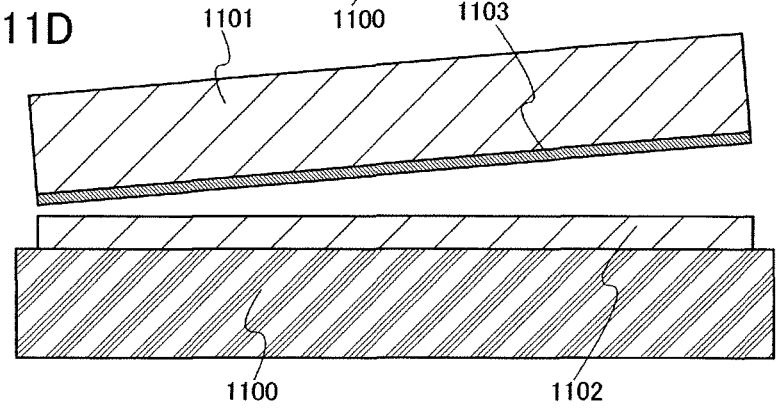

As shown in FIG. 11D, after bonding the single crystal substrate 1101 to the glass substrate 1100, the single crystal substrate 1101 is separated from the glass substrate 1100 using the ion-doped layer 1103 as a cleavage plane, thereby obtaining an SOI substrate. Since the surface of the single crystal substrate 1101 is bonded to the glass substrate 1100, a semiconductor film 1102 having the same crystallinity as the single crystal substrate 1101 is left on the glass substrate 1100.

Before the single crystal substrate 1101 is separated from the glass substrate 1100 using the ion-doped layer 1103 as a cleavage plane, a trigger is preferably made so that separation can be conducted easily. Specifically, pretreatment is performed by which adhesion between the ion-doped layer 1103 and the semiconductor film 1102 is as selected (partially) lowered, whereby separation defects are reduced and a yield is improved. Typically, an example can be given in which a groove is formed in the ion-doped layer 1103 by a laser beam or a dicer from the side of the glass substrate 1100 or the single crystal substrate 1101.

When the single crystal substrate 1101 is separated from the glass substrate 1100, an adhesive sheet which can be separated by light or heat is provided on at least one of the surfaces of the glass substrate 1100 and the single crystal substrate 1101, one of the glass substrate 1100 and the single crystal substrate 1101 is fixed, and the other is separated, so that separation can be conducted easily. At this time, by provision of a supporting member for the other of the glass substrate 1100 and the single crystal substrate 1101, a separation process can be conducted easily.

Note that the semiconductor film obtained by separation is preferably subjected to chemical mechanical polishing (CMP) so that a surface of the semiconductor film is planarized. Further, the surface of the semiconductor film may be planarized by irradiating the surface with a laser beam without using a physical polishing method such as CMP. Note that laser beam irradiation is preferably performed in a nitrogen atmosphere at an oxygen concentration of less than or equal to 10 ppm. This is because there is a possibility that the surface of the semiconductor film becomes rough when irradiation with a laser beam is performed in an oxygen atmosphere. CMP or the like may be performed in order that the semiconductor film obtained is thinned.

That is the explanation about the manufacturing method of an SOI substrate by bonding a substrate having an insulating surface such as a glass substrate or the like and a single crystal substrate.

Then, description of FIG. 9 is made again. Next, after the island-shaped semiconductor region 331 is formed, a very small amount of an impurity element (boron or phosphorus) is added in order to control a threshold value of a transistor, if necessary. Here, an ion doping method is used, in which diborane ($B_2H_6$) is not separated by mass but excited by plasma.

Next, the oxide film is removed with an etchant containing a hydrofluoric acid, and at the same time, the surface of the island-shaped semiconductor region 331 is washed. After that, an insulating film containing silicon as its main component, which becomes a gate insulating film 313, is formed. Here, a silicon oxide film containing nitrogen (composition ratio: Si=32%, O=59%, N=7%, and H=2%) is formed to have a thickness of 115 nm by a plasma CVD method.

Figure 9B:
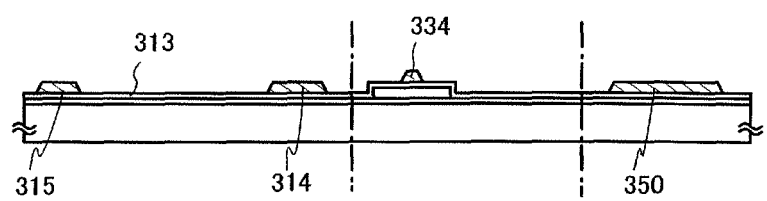

Next, after a metal film is formed over the gate insulating film 313, a second photomask is used to form gate electrodes 334, wirings 314 and 315, and a terminal electrode 350 (see FIG. 9B). As the metal film, for example, a film is used, in which tantalum nitride and tungsten are stacked to be 30 nm and 370 nm respectively.

Additionally, as the gate electrodes 334, the wirings 314 and 315, and the terminal electrode 350, instead of the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; a single-layer film formed from nitride thereof, for example, titanium nitride, tungsten nitride, tantalum nitride or molybdenum nitride may be used.

Figure 9C:
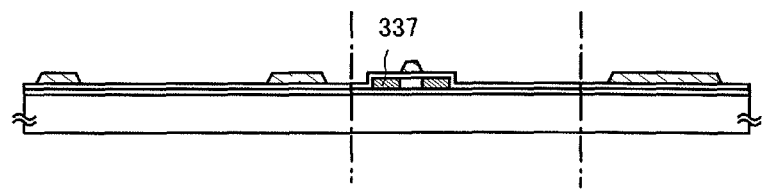

Next, an impurity imparting one conductivity type is introduced into the island-shaped semiconductor region 331 to form a source region and a drain region 337 of a transistor 113 (see FIG. 9C). In this embodiment mode, an n-channel transistor is formed; therefore, an impurity imparting n-type conductivity, for example, phosphorus (P) or arsenic (As) is introduced into the island-shaped semiconductor region 331.

Next, a first interlayer insulating film (not shown) including a silicon oxide film is formed to be 50 nm thick by a CVD method, and after that, a step is performed, in which the impurity element added to each of the island-shaped semiconductor regions is activated. This activation process is performed by a rapid thermal annealing method (RTA method) using a lamp light source; an irradiation method with a YAG laser or an excimer laser from the back side; heat treatment using a furnace; or a method which is a combination of any of the foregoing methods.

Then, a second interlayer insulating film 316 including a silicon nitride film containing hydrogen and oxygen is formed, for example, to be 10 nm thick.

Figure 9D:
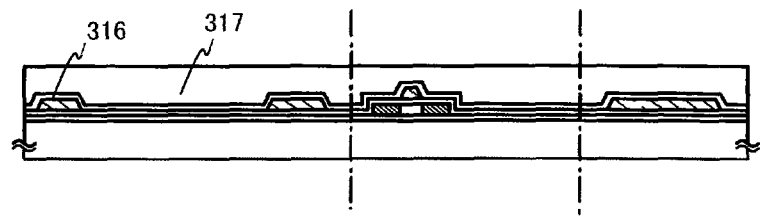

Next, a third interlayer insulating film 317 formed of an insulating material is formed over the second interlayer insulating film 316 (see FIG. 9D). An insulating film obtained by a CVD method can be used for the third interlayer insulating film 317. In this embodiment mode, in order to improve adhesion, a silicon oxide film containing nitrogen is formed to be 900 nm thick as the third interlayer insulating film 317.

Then, heat treatment (heat treatment at 300 to 550° C. for 1 to 12 hours, for example, at 410° C. for 1 hour in a nitrogen atmosphere) is performed to hydrogenate the island-shaped semiconductor region. This step is performed to terminate a dangling bond of the island-shaped semiconductor region by hydrogen contained in the second interlayer insulating film 316. The island-shaped semiconductor region can be hydrogenated regardless of whether or not the gate insulating film 313 is formed.

In addition, as the third interlayer insulating film 317, an insulating film using siloxane and a stacked structure thereof may be used. Siloxane is composed of a skeleton structure of a bond of silicon (Si) and oxygen (O). A compound containing at least hydrogen (such as an alkyl group or an aromatic hydrocarbon) is used as a substituent. Fluorine may be included as a substituent. Alternatively, a compound containing at least hydrogen and fluorine can be used as a substituent.

In a case where an insulating film using siloxane and a stacked structure thereof are used as the third interlayer insulating film 317, after formation of the second interlayer insulating film 316, heat treatment to hydrogenate the island-shaped semiconductor films can be performed, and then, the third interlayer insulating film 317 can be formed.

Next, a mask is formed of a resist using a third photomask, and the first interlayer insulating film, the second interlayer insulating film 316, the third and interlayer insulating film 317, or the gate insulating film 313 are etched to form a contact hole as selected. Then, a mask is formed of a resist is removed.

Note that the third interlayer insulating film 317 may be formed if necessary. In a case where the third interlayer insulating film 317 is not formed, the first interlayer insulating film, the second interlayer insulating film 316, and the gate insulating film 313 are etched as selected after formation of the second interlayer insulating film 316 to form a contact hole.

Next, after formation of a metal stacked film by a sputtering method, a mask is formed of a resist using a fourth photomask, and then, the metal film is etched as selected to form a wiring 319, a connection electrode 320, a terminal electrode 351, a source electrode or a drain electrode 341 of the transistor 113. Then, a mask is formed of a resist is removed. Note that the metal film of this embodiment mode is a stacked-layer film with three films: a Ti film with a thickness of 100 nm, an Al film containing a very small amount of Si with a thickness of 350 nm, and a Ti film with a thickness of 100 nm.

In addition, in a case where each of the wiring 319, the connection electrode 320, the terminal electrode 351, and the source electrode or the drain electrode 341 of the transistor 113 is formed of a single-layer conductive film, a titanium film (Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride thereof, for example, titanium nitride, tungsten nitride, tantalum nitride, or molybdenum nitride may be used. The number of times of deposition can be reduced in the manufacturing process, by formation of each of the wiring 319, the connection electrode 320, the terminal electrode 351, and the source electrode or the drain electrode 341 of the transistor 113 as a single-layer film.

The top gate transistor 113 using a polycrystalline silicon film can be manufactured through the process described above.

Figure 10A:
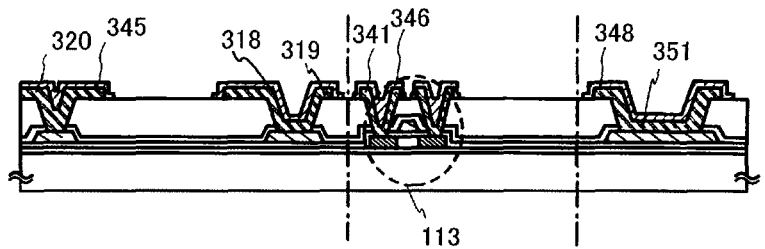
FIGS. 10A to 10C are views showing a manufacturing process of a photoelectric conversion device of the present invention.

Next, after formation of a conductive metal film (such as titanium (Ti), molybdenum (Mo), or the like) which is not likely to be an alloy by reacting with a photoelectric conversion layer (typically, amorphous silicon) which is formed later, a mask is formed of a resist using a fifth photomask, and then, the conductive metal film is etched as selected to form protective electrodes 318, 345, 346, and 348 which cover the wiring 319 (see FIG. 10A). Here, a Ti film having a thickness of 200 nm obtained by a sputtering method is used. Note that the connection electrode 320, the terminal electrode 351, and the source electrode or the drain electrode 341 of the transistor 113 are also covered with a conductive metal film. Thus, the conductive metal film also covers a side face where the second Al film is exposed in these electrodes; therefore, the conductive metal film can also prevent diffusion of an aluminum atom to the photoelectric conversion layer.

Note that in a case where each of the wiring 319, the connection electrode 320, the terminal electrode 351, and the source electrode or the drain electrode 341 of the transistor 113 are formed as a single-layer conductive film, the protective electrodes 318, 345, 346, and 348 are not necessarily formed.

Next, a photoelectric conversion layer 111 including a p-type semiconductor layer 111p, an i-type semiconductor layer 111i, and an n-type semiconductor layer 111n is formed over the third interlayer insulating film 317.

The p-type semiconductor layer 111p may be formed by deposition of a semi-amorphous silicon film containing an impurity element belonging to Group 13 of the periodic table such as boron (B) by a plasma CVD method.

In addition, the wiring 319 and the protective electrode 318 are in contact with the bottom layer of the photoelectric conversion layer 111, in this embodiment mode, the p-type semiconductor layer 111p.

After the p-type semiconductor layer 111p is formed, the i-type semiconductor layer 111i and the n-type semiconductor layer 111n are sequentially formed. Accordingly, the photoelectric conversion layer 111 including the p-type semiconductor layer 111p, the i-type semiconductor layer 111i and the n-type semiconductor layer 111n is formed.

As the i-type semiconductor layer 111i, for example, a semi-amorphous silicon film may be formed by a plasma CVD method. Note that as the n-type semiconductor layer 111n, a semi-amorphous silicon film containing an impurity element belonging to Group 15 of the periodic table, for example, phosphorus (P) may be formed, or after formation of a semi-amorphous silicon film, an impurity element belonging to Group 15 of the periodic table may be introduced.

Alternatively, as the p-type semiconductor layer 111p, the i-type semiconductor layer 111i and the n-type semiconductor layer 111n, an amorphous semiconductor film may be used as well as a semi-amorphous semiconductor film.

Figure 10B:
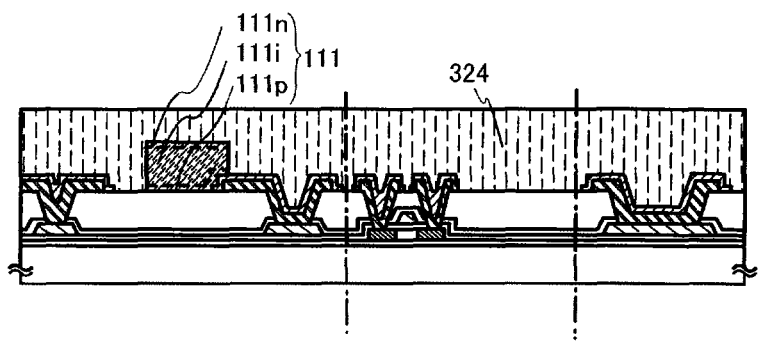

Next, a sealing layer 324 is formed from an insulating material (for example, an inorganic insulating film containing silicon) to have a thickness of 1 to 30 μm over the entire surface to obtain a state shown in FIG. 10B. Here, as an insulating material film, a silicon oxide film containing nitrogen with a thickness of 1 μm is formed by a CVD method. By using insulating film formed by CVD method, improvement in adhesion can be achieved.

Next, after the sealing layer 324 is etched to provide an opening, terminal electrodes 121 and 122 are formed by a sputtering method. Each of the terminal electrode 121 and 122 is a stacked-layer film of a titanium film (Ti film) (100 nm), a nickel film (Ni film) (300 nm), and a gold film (Au film) (50 nm). The thus obtained terminal electrodes 121 and 122 have a fixing intensity of higher than 5 N, which is sufficient fixing intensity as a terminal electrode.

Figure 10C:
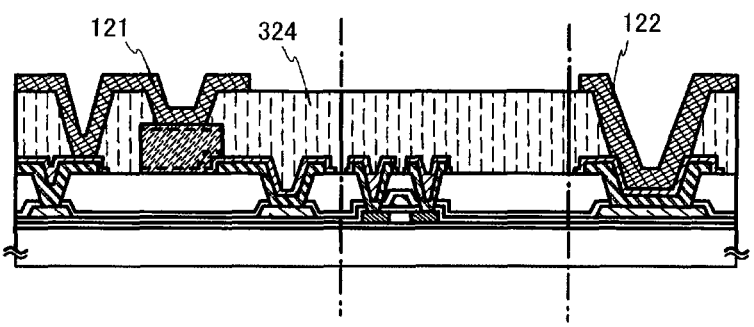

Through the process described above, the terminal electrodes 121 and 122 which can be connected by a solder are formed, and a structure shown in FIG. 10C can be obtained.

Note that the substrate over which a plurality of photoelectric conversion devices is formed is cut into separate pieces, so that the plurality of photoelectric conversion devices is obtained. For example, a large number of photoelectric conversion devices (for example, 2 mm×1.5 mm) can be manufactured from one large-sized substrate (for example, 60 cm×72 cm). Accordingly, the photoelectric conversion device obtained by the above process can be produced in large quantities.

Note that this embodiment mode can be implemented by being combined with any technical elements in other embodiment modes of this specification.

[Embodiment Mode 5]

This embodiment mode will describe a manufacturing method of the photoelectric conversion device mentioned in the above embodiment mode, which is an example different from Embodiment Mode 4, using cross sectional views. In this embodiment mode, a structure of a field effect transistor formed using a bottom gate transistor is described with reference to FIGS. 12A to 14.

Figure 12A:
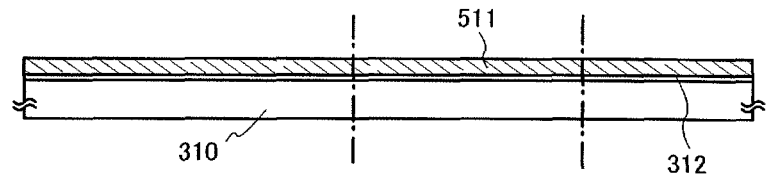
FIGS. 12A to 12E are views showing a manufacturing process of a photoelectric conversion device of the present invention.

First, a base insulating film 312 and a metal film 511 are formed over the substrate 310 (see FIG. 12A). As the metal film 511, in this embodiment mode, a stacked-layer film of tantalum nitride having a thickness of 30 nm and tungsten having a thickness of 370 nm is used, for example.

In addition, as the metal film 511, instead of the above film, a single-layer film formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) and copper (Cu), or an alloy material or a compound material containing the above element as its main component; or a single-layer film formed from nitride thereof such as titanium nitride, tungsten nitride, tantalum nitride, or molybdenum nitride may be used.

Note that the metal film 511 may be formed directly on the substrate 310 without formation of the base insulating film 312 over the substrate 310.

Figure 12B:
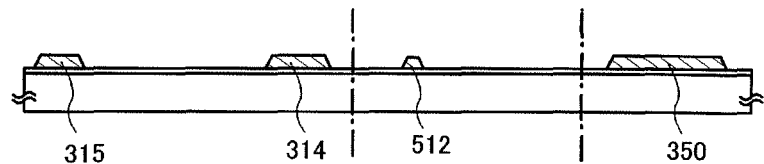
Figure 12C:
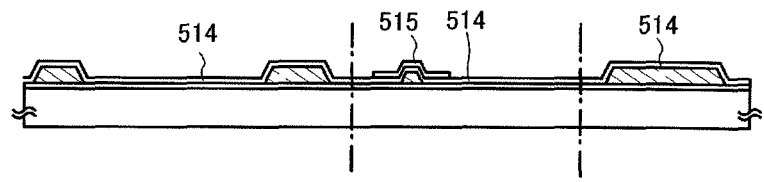

Next, the metal film 511 is used to form a gate electrode 512, wirings 314 and 315 and a terminal electrode 350 (see FIG. 12B).

Next, a gate insulating film 514 which covers the gate electrode 512, the wirings 314 and 315 and the terminal electrode 350 is formed. In this embodiment mode, the gate insulating film 514 is formed using an insulating film containing silicon as its main component, for example, a silicon oxide film containing nitrogen (composition ratio Si=32%, O=59%, N=7%, H=2%) having a thickness of 115 nm by a plasma CVD method.

Next, an island-shaped semiconductor region 515 is formed over the gate insulating film 514. The island-shaped semiconductor region 515 may be formed by the similar material and manufacturing process to those of the island-shaped semiconductor region 331 described in Embodiment Mode 4 (see FIG. 12C).

Figure 12D:
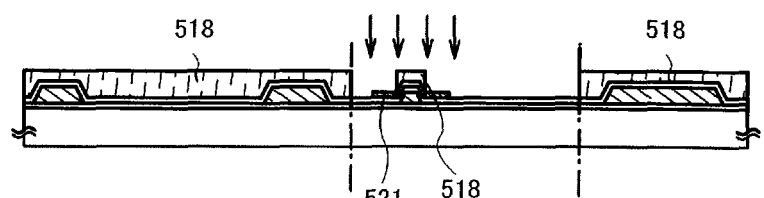

After the island-shaped semiconductor region 515 is formed, a mask 518 is formed to cover portions except for regions which become a source region or a drain region 521 of a transistor 503, and later, an impurity imparting one conductivity type is introduced (see FIG. 12D). As the one conductivity-type impurity, in a case of forming an n-channel transistor, phosphorus (P) or arsenic (As) may be used as an n-type impurity, whereas in a case of forming a p-channel transistor, boron (B) may be used as a p-type impurity. In this embodiment mode, phosphorus (P) which is an n-type impurity is introduced to the island-shaped semiconductor region 515 so that a channel formation region is formed between the source region or the drain region 521 and a source region or a drain region 521 of the transistor 503.

Figure 12E:
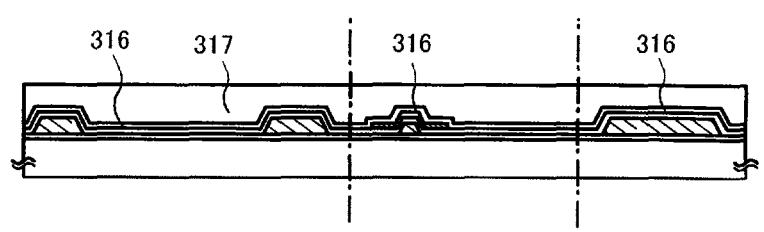

Next, the mask 518 is removed, and a first interlayer insulating film which is not shown, a second interlayer insulating film 316, and a third interlayer insulating film 317 are formed (see FIG. 12E). A material and a manufacturing process of the first interlayer insulating film, the second interlayer insulating film 316, and the third interlayer insulating film 317 may be based on the description in Embodiment Mode 4.

Contact holes are formed in the first interlayer insulating film, the second interlayer insulating film 316, and the third interlayer insulating film 317, a metal film is formed, and further, the metal film is etched as selected to form the wiring 319, the connection electrode 320, the terminal electrode 351, and a source electrode or a drain electrode 531 of the transistor 503. Then, a mask is formed of a resist is removed. Note that the metal film of this embodiment mode is a stacked-layer film including three layers: a Ti film having a thickness of 100 nm, an Al film containing a very small amount of Si having a thickness of 350 nm, and a Ti film having a thickness of 100 nm.

In addition, as for the wiring 319 and a protective electrode thereof 318; the connection electrode 320 and a protective electrode thereof 533; the terminal electrode 351 and a protective electrode thereof 538; the source electrode and the drain electrode 531 of the transistor 503 and a protective electrode thereof 536, each wiring and electrode may be formed using a single-layer conductive film.

Figure 13A:
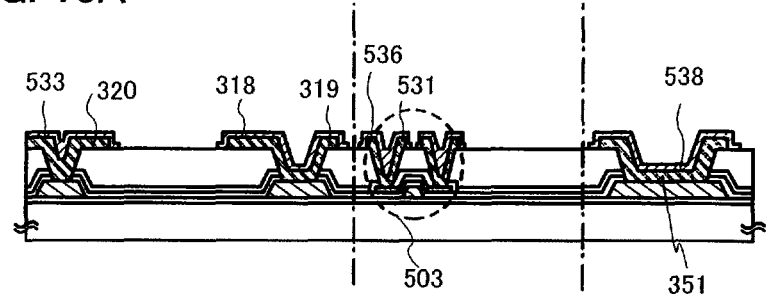
FIGS. 13A to 13C are views showing a manufacturing process of a photoelectric conversion device of the present invention.

Through the above process, bottom gate transistor 503 can be manufactured (see FIG. 13A).

Figure 13B:
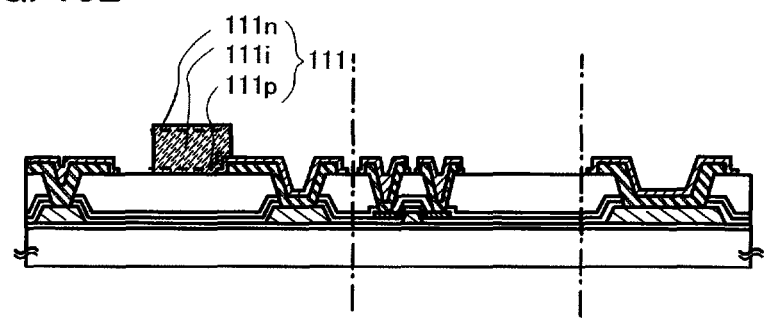

Next, the photoelectric conversion layer 111 including the p-type semiconductor layer 111p, the i-type semiconductor layer 111i, and the n-type semiconductor layer 111n is formed over the third interlayer insulating film 317 (see FIG. 13B). A material, a manufacturing process and the like of the photoelectric conversion layer 111 may be based on the description in Embodiment Mode 4.

Figure 13C:
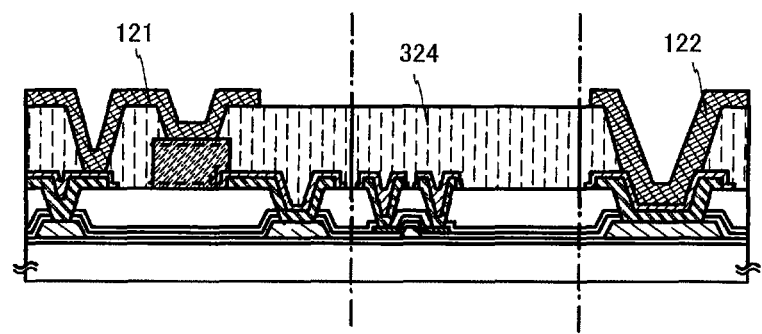

Next, the sealing layer 324 and the terminal electrode electrodes 121 and 122 are formed (FIG. 13C). The terminal electrode 121 is electrically connected to the n-type semiconductor layer 111n, and the terminal electrode 122 is formed in the same process as the terminal electrode 121.

Moreover, a substrate 360 having the electrodes 361 and 362 is mounted using the solders 364 and 363. Note that the electrode 361 on the substrate 360 is mounted on the terminal electrode 121 by the solder 364. In addition, the electrode 362 on the substrate 360 is mounted on the terminal electrode 122 by the solder 363 (see FIG. 14).

Figure 14:
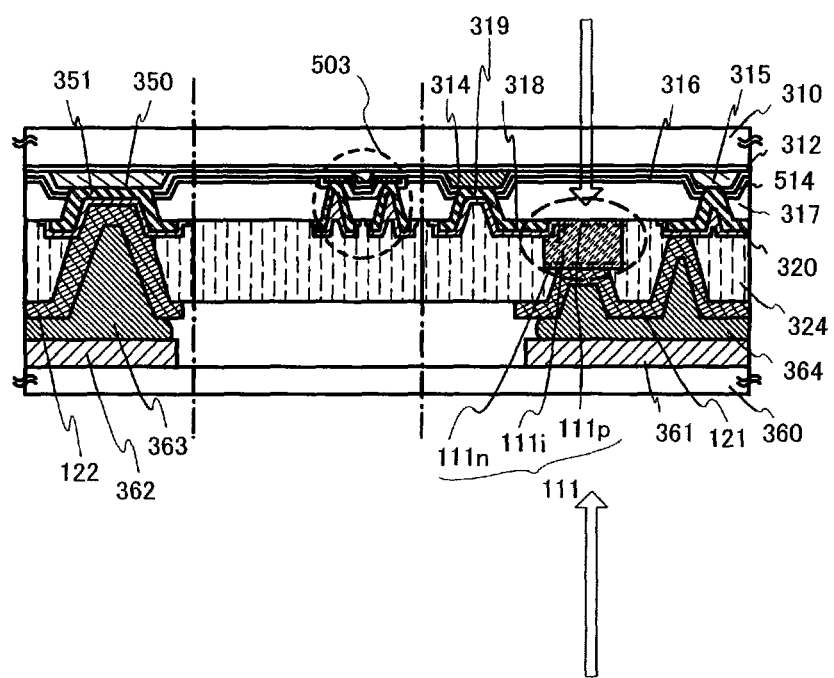
FIG. 14 is a cross sectional view of a photoelectric conversion device of the present invention.

In a photoelectric conversion device shown in FIG. 14, the light which enters the photoelectric conversion layer 111 can enter both the substrate 310 side and the substrate 360 side by using the light-transmitting substrates 310 and 360.

Note that this embodiment mode can be implemented by being combined with any technical elements in other embodiment modes of this specification.

[Embodiment Mode 6]

This embodiment mode will describe an example in which a photoelectric conversion device of the present invention is provided in a housing to control the incident direction of light, with reference to FIGS. 15A to 16B.

Figure 15A:
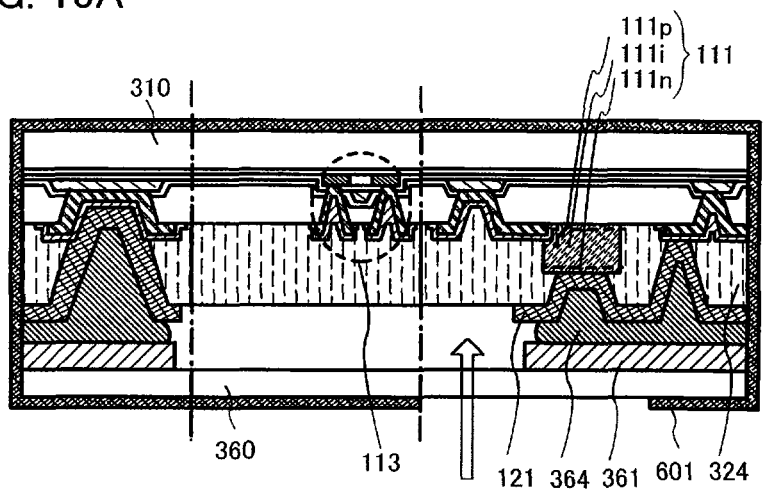
FIGS. 15A and 15B are cross sectional views of a photoelectric conversion device of the present invention.

FIG. 15A shows that after the terminal electrode 121 in a photoelectric conversion device shown in FIG. 10C is mounted on the electrode 361 over the substrate 360 by the solder 364, a housing 601 is formed so that light enters the photoelectric conversion layer 111 not from a substrate 310 side but from a substrate 360 side. An opening is provided in the housing 601 on the substrate 360 side of a region where the photoelectric conversion layer 111 is formed.

Although the terminal electrode 121, the electrode 361, and the solder 364 exist in FIG. 15A, the incident light from the substrate 360 side enters the photoelectric conversion layer 111 obliquely through the sealing layer 324, so that the photocurrent is generated and light can be detected.

Any material may be used for the housing 601, and a housing 602, a housing 603, and a housing 604, which will be mentioned below, as long as the material has a function of blocking light. For example, a metal material, a resin material including black pigment, or the like may be used for the material of the housing.

Figure 15B:
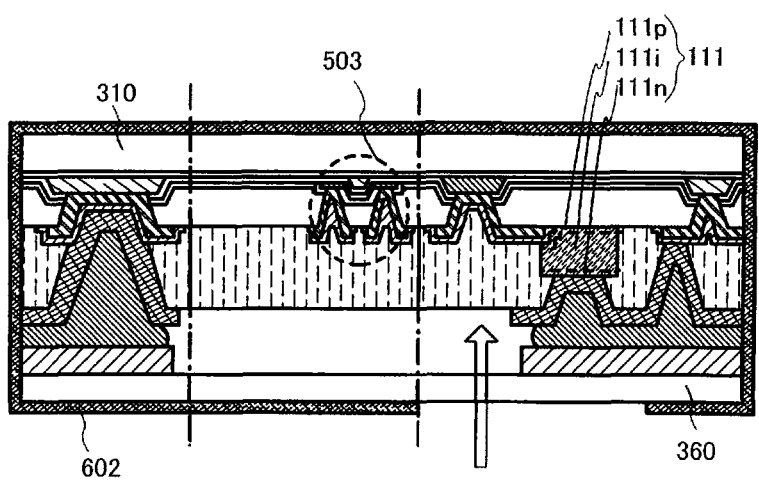

In FIG. 15B, the photoelectric conversion device shown in FIG. 14 is provided with a housing 602 so that light enters a photoelectric conversion layer 111 not from a substrate 310 side but from a substrate 360 side. An opening is provided in the housing 602 on the substrate 360 side of a region where the photoelectric conversion layer 111 is formed.

In FIG. 15B as well as FIG. 15A, the incident light from the substrate 360 side enters the photoelectric conversion layer 111 obliquely through the sealing layer 324, so that the photocurrent is generated and light can be detected.

Figure 16A:
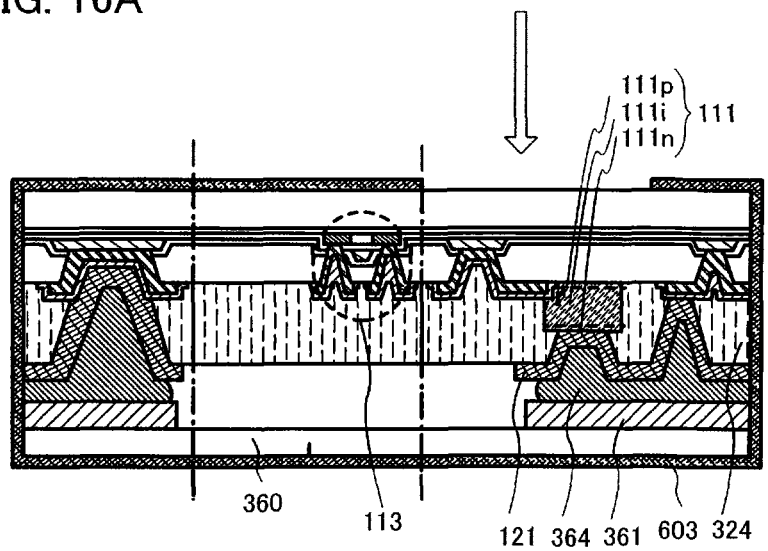
FIGS. 16A and 16B are cross sectional views of a photoelectric conversion device of the present invention.

FIG. 16A shows that after the terminal electrode 121 in a photoelectric conversion device shown in FIG. 10C is mounted on the electrode 361 over the substrate 360 by the solder 364, the housing 603 is formed so that light enters a photoelectric conversion layer 111 not from the substrate 360 side but from the substrate 310 side. An opening is provided in the housing 603 on the substrate 310 side of a region where the photoelectric conversion layer 111 is formed.

In FIG. 16A, the incident light from the substrate 310 side enters the photoelectric conversion layer 111, so that the photocurrent is generated and light can be detected.

Figure 16B:
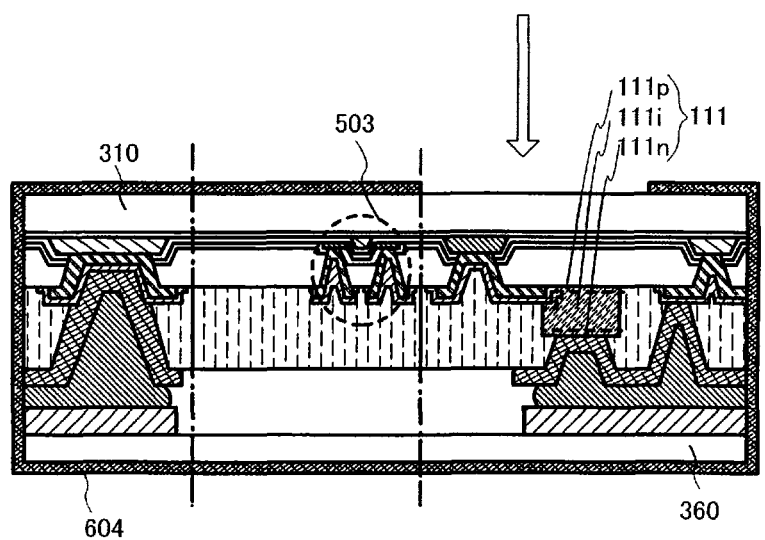

In FIG. 16B the photoelectric conversion device shown in FIG. 14 is provided with a housing 604 so that light enters the photoelectric conversion layer 111 not from the substrate 360 side but from the substrate 310 side. An opening is provided in the housing 604 on the substrate 310 side of a region where the photoelectric conversion layer 111 is formed.

In FIG. 16B, the incident light entered from the substrate 310 side enters the photoelectric conversion layer 111, so that the photocurrent is generated and light can be detected.

Note that this embodiment mode can be implemented by being combined with any technical elements in other embodiment modes of this specification.

[Embodiment Mode 7]

In this embodiment mode, an example in which a photoelectric conversion device obtained by the present invention is incorporated in various electronic devices is described. Electronic devices to which the present invention is applied include a computer, a display, a mobile phone, a TV set, and the like. Specific examples of those electronic devices are shown in FIGS. 17 to 21B.

Figure 17:
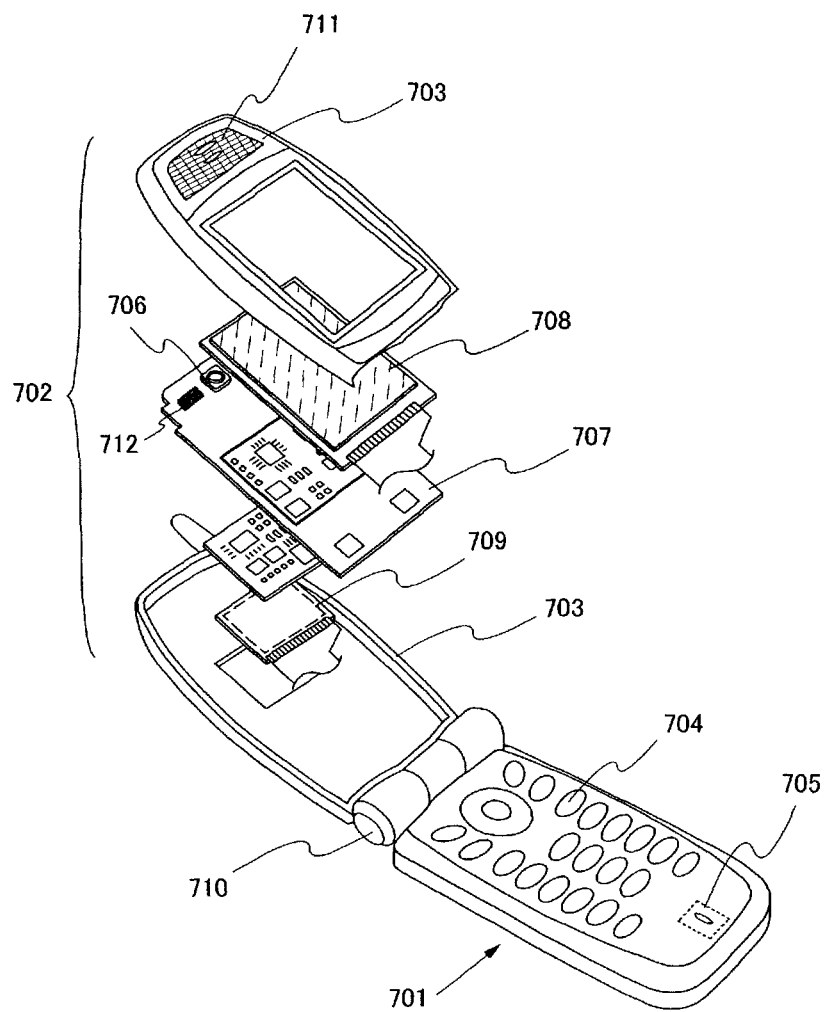
FIG. 17 is a view showing a device on which a photoelectric conversion device of the present invention is mounted.

FIG. 17 shows a mobile phone and includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711, and a photoelectric conversion device 712. The present invention can be applied to the photoelectric conversion device 712.

The photoelectric conversion device 712 detects the light which is transmitted through the light-transmitting material portion 711, and the luminance of the display panel (A) 708, the display panel (B) 709 is controlled based on the illuminance of external light that is detected, or illumination of the operation keys 704 is controlled based on the illuminance obtained by the photoelectric conversion device 712. Accordingly, current consumption of the mobile phone can be reduced.

Figure 18A:
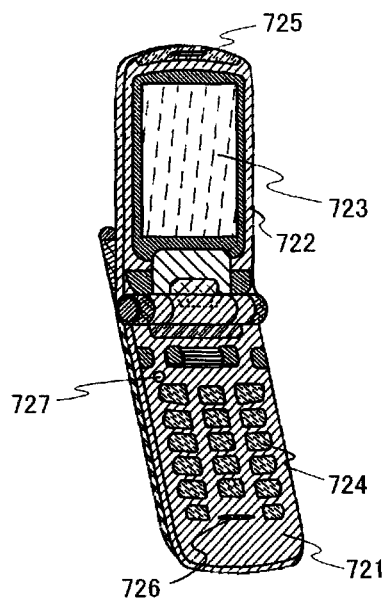
FIGS. 18A and 18B are views each showing a device on which a photoelectric conversion device of the present invention is mounted.
Figure 18B:
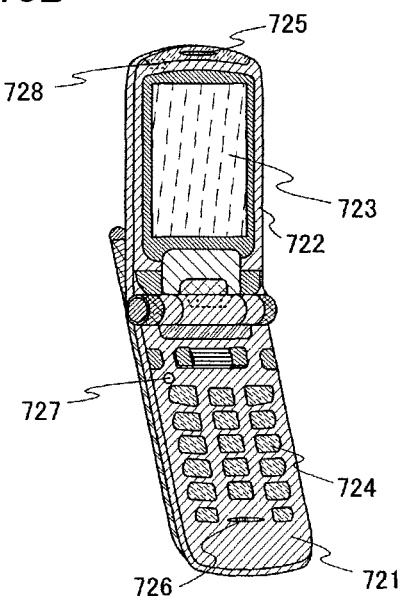

FIGS. 18A and 18B show another example of a mobile phone. In FIGS. 18A and 18B, reference numeral 721 denotes a main body, 722 denotes a housing, 723 denotes a display panel, 724 denotes operation keys, 725 denotes an audio output portion, 726 denotes an audio input portion, 727 denotes a photoelectric conversion device, and 728 denotes a photoelectric conversion device.

In the mobile phone shown in FIG. 18A, the luminance of the display panel 723 and the operation keys 724 can be controlled by detecting the light from the exterior with the photoelectric conversion device 727 which is provided in the main body 721.

In the mobile phone shown in FIG. 18B, the photoelectric conversion device 728 is provided inside the main body 721 in addition to the structure of FIG. 18A. By the photoelectric conversion device 728, the luminance of the backlight which is provided in the display panel 723 also can be detected.

Figure 19A:
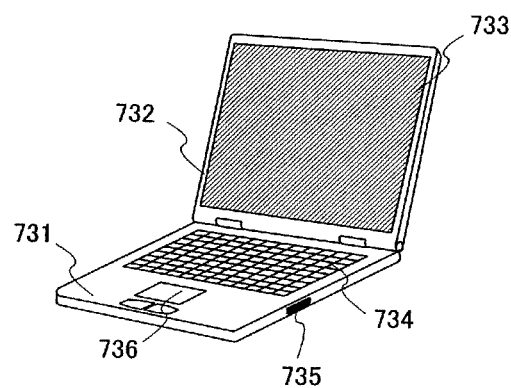
FIGS. 19A and 19B are views each showing a device on which a photoelectric conversion device of the present invention is mounted.

FIG. 19A shows a computer including a main body 731, a housing 732, a display portion 733, a keyboard 734, an external connection port 735, a pointing device 736, and the like.

Figure 19B:
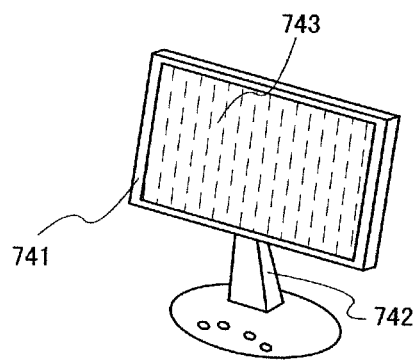

FIG. 19B shows a display device, and corresponds to a television receiver or the like. The display device includes a housing 741, a supporting base 742, a display portion 743, and the like.

Figure 20:
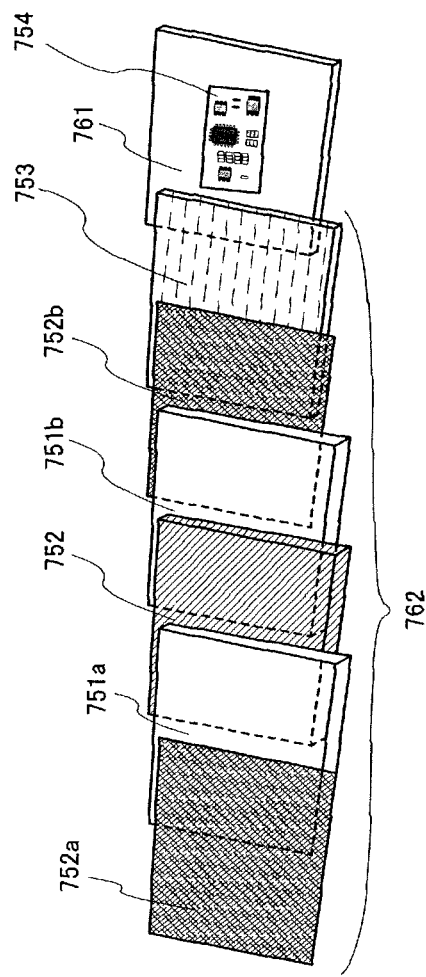
FIG. 20 is a view showing a device on which a photoelectric conversion device of the present invention is mounted.

FIG. 20 shows a detailed structure in the case of using a liquid crystal panel as a display portion 733 provided in a computer shown in FIG. 19A, and as the display portion 743 of the display device shown in FIG. 19B.

A liquid crystal panel 762 shown in FIG. 20 is incorporated in a housing 761 and includes substrates 751$a$ and 751$b$, a liquid crystal layer 752 interposed between the substrates 751$a$ and 751$b$, polarizing filters 752$a$ and 752$b$, a backlight 753, and the like. A housing 761 is provided with a photoelectric conversion device 754.

The photoelectric conversion device 754 which is manufactured using the present invention detects the amount of light from the backlight 753, and the information is fed back to adjust the luminance of the liquid crystal panel 762.

Figure 21A:
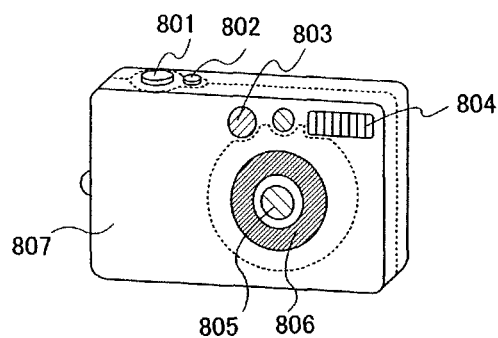
FIGS. 21A and 21B are views showing a device on which a photoelectric conversion device of the present invention is mounted.
Figure 21B:
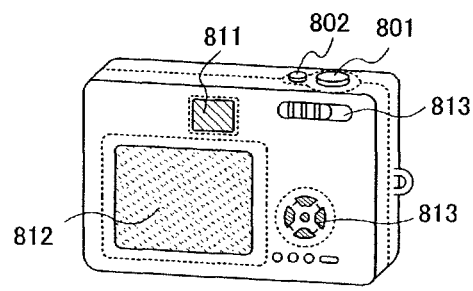

FIGS. 21A and 21B are views each showing an example in which the photoelectric conversion device of the present invention is incorporated in a camera such as a digital camera. FIG. 21A is a front perspective view seen from the front side of the digital camera, and FIG. 21B is a back perspective view seen from the back side of the digital camera. In FIG. 21A, the digital camera is provided with a release button 801, a main switch 802, a viewfinder 803, a flush portion 804, a lens 805, a lens barrel 806, and a housing 807.

In addition, in FIG. 21B, a viewfinder eyepiece 811, a monitor 812, and operation buttons 813 are provided.

When the release button 801 is pressed down halfway, a focusing adjusting mechanism and an exposure adjusting mechanism are operated, and when the release button is pressed down fully, a shutter is opened.

The main switch 802 switches on or off of a power source of a digital camera by being pressed or rotated.

The viewfinder 803 is placed at the upper portion of the lens 805 of a front side of the digital camera, and is a device for recognizing an area which is taken or a focus position from the viewfinder eyepiece 811 shown in FIG. 21B.

The flush portion 804 is placed at the upper portion of the front side of the digital camera, and when object luminance is low, supporting light is emitted at the same time as the release button is pressed down so that the shutter is opened.

The lens 805 is placed at the front face of the digital camera. The lens is formed of a focusing lens, a zoom lens, or the like, and forms a photographing optical system with a shutter and aperture that are not shown. Note that an image pickup device such as charge coupled device (CCD) is provided at the rear of the lens.

The lens barrel 806 moves a lens position to adjust the focus of the focusing lens, the zoom lens, and the like. When shooting, the lens barrel is slid out to move the lens 805 forward. In addition, when carrying the camera, the lens 805 is moved backward so as to make the camera compact. Note that a structure is employed in this embodiment mode, in which the lens barrel is slid out so that the object can be shot by being zoomed; however, the present invention is not limited the structure. Instead, a digital camera may employ a structure in which zoom shooting can be conducted without sliding out the lens barrel by a photographing optical system inside the housing 807.

The viewfinder eyepiece 811 is provided at the upper portion of the rear side of the digital camera, for looking through when checking an area which is taken or a focus point.

The operation buttons 813 are buttons for various functions that are provided at the rear side of the digital camera and include a set up button, a menu button, a display button, a main functional button, a selection button and the like.

When the photoelectric conversion device of the present invention is incorporated in the camera shown in FIGS. 21A and 21B, the photoelectric conversion device can detect the light intensity and whether light exists or not; accordingly, an exposure adjustment or the like of the camera can be performed. By the photoelectric conversion device of the present invention, the number of field effect transistor included in the photoelectric conversion device can be reduced, and the packaging area can be reduced, whereby the device can be miniaturized. Miniaturization of a part like an optical sensor provided with a photoelectric conversion device is effective particularly when the part is used for portable electronic devices.

In addition, the photoelectric conversion device of the present invention can also be applied to other electronic devices such as a projection TV and a navigation system, for example. In other words, the photoelectric conversion device of the present invention can be applied to anything that is necessary to detect light.

Note that this embodiment mode can be implemented by being combined with any technical elements in other embodiment modes of this specification.

This application is based on Japanese Patent Application serial No. 2007-171483 filed with Japan Patent Office on Jun. 29, 2007, the entire contents of which are hereby incorporated by reference.

What is claimed is:

1. A photoelectric conversion device comprising:
   a voltage detection circuit; and
   a photoelectric conversion circuit including:
   a photoelectric conversion element;
   a first transistor and a second transistor;
   a field effect transistor, and
   a buffer,
   wherein one of a source and a drain of the first transistor is directly connected to one of a source and a drain of the second transistor,
   wherein the first transistor is directly connected to the photoelectric conversion element,
   wherein the other of the source and the drain of the second transistor is directly connected to a drain and a gate of the field effect transistor,
   wherein the gate of the field effect transistor is configured to be electrically connected to the voltage detection circuit so as to detect a voltage of the gate of the field effect transistor,
   wherein a source of the field effect transistor is directly connected to the photoelectric conversion element,
   wherein the buffer is an operational amplifier, an output terminal of which is electrically connected to the voltage detection circuit and an inverting input terminal of the operational amplifier, and
   wherein a noninverting input terminal of the operational amplifier is electrically connected to the gate of the field effect transistor.

2. The photoelectric conversion device according to claim 1, wherein the photoelectric conversion element includes a p-type semiconductor layer, an i-type semiconductor layer, and an n-type semiconductor layer.

3. The photoelectric conversion device according to claim 1, wherein the first transistor is a p-channel transistor.

4. The photoelectric conversion device according to claim 1, wherein the field effect transistor is a thin film transistor.

5. The photoelectric conversion device according to claim 1, wherein the photoelectric conversion element and the field effect transistor are provided over a light-transmitting substrate.

6. The photoelectric conversion device according to claim 1,
   wherein the photoelectric conversion device includes a plurality of field effect transistors, and
   wherein the plurality of field effect transistors are electrically connected in parallel.

7. An electronic device comprising the photoelectric conversion device according to claim 1 in a display portion.

8. The photoelectric conversion device according to claim 1, wherein each of the first transistor and the second transistor is a field effect transistor.

9. The photoelectric conversion device according to claim 1,
   wherein each of the first transistor and the second transistor is included in a current mirror circuit, and wherein the current mirror circuit is configured to amplify and output a photocurrent generated at the photoelectric conversion element.

10. A photoelectric conversion device comprising:
a voltage detection circuit;
a photoelectric conversion circuit including:
  a photoelectric conversion element;
  a current mirror circuit comprising a first field effect transistor and a second field effect transistor; and
  a third field effect transistor; and
a buffer,
wherein the current mirror circuit is configured to amplify and output a photocurrent generated at the photoelectric conversion element,
wherein one of a source and a drain of the first field effect transistor is directly connected to one of a source and a drain of the second field effect transistor,
wherein the first field effect transistor is directly connected to the photoelectric conversion element,
wherein the other of the source and the drain of the second field effect transistor is directly connected to a drain and a gate of the third field effect transistor,
wherein the gate of the third field effect transistor is configured to be electrically connected to the voltage detection circuit so as to detect a voltage of the gate of the third field effect transistor,
wherein a source of the third field effect transistor is electrically connected to the other of the source and the drain of the first field effect transistor through the photoelectric conversion element,
wherein the buffer is an operational amplifier, an output terminal of which is electrically connected to the voltage detection circuit and an inverting input terminal of the operational amplifier, and
wherein a noninverting input terminal of the operational amplifier is electrically connected to the gate of the third field effect transistor.

11. The photoelectric conversion device according to claim 10, wherein the photoelectric conversion element includes a p-type semiconductor layer, an i-type semiconductor layer, and an n-type semiconductor layer.

12. The photoelectric conversion device according to claim 10, wherein the first field effect transistor included in the current mirror circuit is a p-channel transistor.

13. The photoelectric conversion device according to claim 10, wherein the third field effect transistor is a thin film transistor.

14. The photoelectric conversion device according to claim 10, wherein the photoelectric conversion element and the third field effect transistor are provided over a light-transmitting substrate.

15. The photoelectric conversion device according to claim 10,
wherein the photoelectric conversion device includes a plurality of field effect transistors, and
wherein the plurality of field effect transistors are electrically connected in parallel.

16. An electronic device comprising the photoelectric conversion device according to claim 10 in a display portion.

17. An electronic device comprising:
a display panel;
a voltage detection circuit operationally connected to the display panel; and
a photoelectric conversion device operationally connected to the voltage detection circuit, the photoelectric conversion device comprising:
  a photoelectric conversion circuit including:
    a photoelectric conversion element;
    a first transistor and a second transistor;
    a field effect transistor, and
    a buffer,
wherein one of a source and a drain of the first transistor is directly connected to one of a source and a drain of the second transistor,
wherein the first transistor is directly connected to the photoelectric conversion element,
wherein the other of the source and the drain of the second transistor is directly connected to a drain and a gate of the field effect transistor,
wherein the gate of the field effect transistor is configured to be electrically connected to the voltage detection circuit so as to detect a voltage of the gate of the field effect transistor,
wherein the buffer is an operational amplifier, an output terminal of which is electrically connected to the voltage detection circuit and an inverting input terminal of the operational amplifier, and
wherein a noninverting input terminal of the operational amplifier is electrically connected to the gate of the field effect transistor.

18. The photoelectric conversion device according to claim 17, wherein the photoelectric conversion element includes a p-type semiconductor layer, an i-type semiconductor layer, and an n-type semiconductor layer.

19. The photoelectric conversion device according to claim 17, wherein the first transistor is a p-channel transistor.

20. The photoelectric conversion device according to claim 17, wherein the field effect transistor is a thin film transistor.

21. The photoelectric conversion device according to claim 17, wherein the photoelectric conversion element and the field effect transistor are provided over a light-transmitting substrate.

22. The photoelectric conversion device according to claim 17,
wherein the photoelectric conversion device includes a plurality of field effect transistors, and
wherein the plurality of field effect transistors are electrically connected in parallel.

23. The electronic device according to claim 17, wherein each of the first transistor and the second transistor is a field effect transistor.

24. The electronic device according to claim 17,
wherein each of the first transistor and the second transistor is included in a current mirror circuit, and
wherein the current mirror circuit is configured to amplify and output a photocurrent generated at the photoelectric conversion element.

25. An electronic device comprising:
a display panel;
a voltage detection circuit operationally connected to the display panel;
a photoelectric conversion device operationally connected to the voltage detection circuit, the photoelectric conversion device comprising:
  a photoelectric conversion circuit including:
    a photoelectric conversion element;
    a current mirror circuit comprising a first field effect transistor and a second field effect transistor; and
    a third field effect transistor; and
  a buffer,
wherein the current mirror circuit is configured to amplify and output a photocurrent generated at the photoelectric conversion element, wherein one of a source and a drain of the first field effect transistor is directly connected to one of a source and a drain of the second field effect transistor, wherein the first field effect transistor is directly connected to the photoelectric conversion element, wherein the other of the source and the drain of the second field effect transistor is directly connected to a drain and a gate of the third field effect transistor, wherein the gate of the third field effect transistor is configured to be electrically connected to the voltage detection circuit so as to detect a voltage of the gate of the third field effect transistor, wherein a source of the third field effect transistor is electrically connected to the other of the source and the drain of the first field effect transistor through the photoelectric conversion element, wherein the buffer is an operational amplifier, an output terminal of which is electrically connected to the voltage detection circuit and an inverting input terminal of the operational amplifier, and wherein a noninverting input terminal of the operational amplifier is electrically connected to the gate of the third field effect transistor.

26. The photoelectric conversion device according to claim 25, wherein the photoelectric conversion element includes a p-type semiconductor layer, an i-type semiconductor layer, and an n-type semiconductor layer.

27. The photoelectric conversion device according to claim 25, wherein the first field effect transistor included in the current mirror circuit is a p-channel transistor.

28. The photoelectric conversion device according to claim 25, wherein the third field effect transistor is a thin film transistor.

29. The photoelectric conversion device according to claim 25, wherein the photoelectric conversion element and the third field effect transistor are provided over a light-transmitting substrate.

30. The photoelectric conversion device according to claim 25,
wherein the photoelectric conversion device includes a plurality of field effect transistors, and
wherein the plurality of field effect transistors are electrically connected in parallel.

31. A photoelectric conversion device comprising:
a voltage detection circuit; and
a photoelectric conversion circuit including:
a photoelectric conversion element;
a first transistor and a second transistor;
a field effect transistor, and
a buffer, wherein one of a source and a drain of the first transistor is directly connected to one of a source and a drain of the second transistor, wherein the first transistor is directly connected to the photoelectric conversion element, wherein the other of the source and the drain of the second transistor is directly connected to a drain and a gate of the field effect transistor, wherein the gate of the field effect transistor is configured to be electrically connected to the voltage detection circuit so as to detect a voltage of the gate of the field effect transistor, wherein the buffer is an operational amplifier, an output terminal of which is electrically connected to the voltage detection circuit and an inverting input terminal of the operational amplifier, and wherein a noninverting input terminal of the operational amplifier is electrically connected to the gate of the field effect transistor.

32. The photoelectric conversion device according to claim 31, wherein the photoelectric conversion element includes a p-type semiconductor layer, an i-type semiconductor layer, and an n-type semiconductor layer.

33. The photoelectric conversion device according to claim 31, wherein the first transistor is a p-channel transistor.

34. The photoelectric conversion device according to claim 31, wherein the field effect transistor is a thin film transistor.

35. The photoelectric conversion device according to claim 31, wherein the photoelectric conversion element and the field effect transistor are provided over a light-transmitting substrate.

36. The photoelectric conversion device according to claim 31,
wherein the photoelectric conversion device includes a plurality of field effect transistors, and
wherein the plurality of field effect transistors are electrically connected in parallel.

37. An electronic device comprising the photoelectric conversion device according to claim 31 in a display portion.

38. The photoelectric conversion device according to claim 31, wherein each of the first transistor and the second transistor is a field effect transistor.

39. The photoelectric conversion device according to claim 31,
wherein each of the first transistor and the second transistor is included in a current mirror circuit, and
wherein the current mirror circuit is configured to amplify and output a photocurrent generated at the photoelectric conversion element.

* * * * *